(12) United States Patent
McCallister et al.

(10) Patent No.: US 7,747,224 B2
(45) Date of Patent: Jun. 29, 2010

(54) METHOD AND APPARATUS FOR ADAPTIVELY CONTROLLING SIGNALS

(75) Inventors: Ronald D. McCallister, Scottsdale, AZ (US); Eric M. Brombaugh, Mesa, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 0 days.

(21) Appl. No.: 12/335,969

(22) Filed: Dec. 16, 2008

(65) Prior Publication Data
US 2009/0097581 A1    Apr. 16, 2009

Related U.S. Application Data

(62) Division of application No. 11/417,477, filed on Apr. 27, 2006.

(51) Int. Cl.
*H04B 17/00* (2006.01)
(52) U.S. Cl. .................. 455/67.11; 455/80; 455/88; 455/101; 375/267; 375/295; 375/296; 375/285; 375/297
(58) Field of Classification Search ............ 455/80, 455/88, 101; 375/267, 295, 296, 285, 297
See application file for complete search history.

(56) References Cited

U.S. PATENT DOCUMENTS

| | | | |
|---|---|---|---|
| 4,298,871 A |   | 11/1981 | Kennedy et al. |
| 4,301,536 A | * | 11/1981 | Favin et al. .......... 714/714 |
| 5,519,530 A |   | 5/1996 | Utsumi |
| 5,646,631 A |   | 7/1997 | Arntz |
| 6,104,761 A | * | 8/2000 | McCallister et al. ........ 375/296 |
| 6,236,864 B1 |   | 5/2001 | McGowan et al. |
| 6,356,606 B1 |   | 3/2002 | Hahm |
| 6,366,319 B1 |   | 4/2002 | Bills |
| 6,366,619 B1 | * | 4/2002 | McCallister et al. ........ 375/295 |
| 6,519,244 B1 |   | 2/2003 | Unno |

(Continued)

OTHER PUBLICATIONS

International Preliminary Report on Patentability of PCT/US2007/067388—Date of issuance of this report: Oct. 28, 2008, 10 pages.

(Continued)

*Primary Examiner*—Matthew D Anderson
*Assistant Examiner*—April G Gonzales
(74) *Attorney, Agent, or Firm*—Locke Lord Bissell & Liddell LLP

(57) ABSTRACT

A signal processing system according to various aspects of the present invention includes an excursion signal generator, a scaling system and a filter system. The excursion signal generator identifies a peak portion of a signal that exceeds a threshold and generates a corresponding excursion signal. The scaling system applies a real scale factor to contiguous sets of excursion samples in order to optimize peak-reduction performance. The filter system filters the excursion signal to remove unwanted frequency components from the excursion signal. The filtered excursion signal may then be subtracted from a delayed version of the original signal to reduce the peak. The signal processing system may also control power consumption by adjusting the threshold. The signal processing system may additionally adjust the scale of the excursion signal and/or individual channel signals, such as to meet constraints on channel noise and output spectrum, or to optimize peak reduction. The magnitude threshold, excursion signal and/or individual channel signals may also be adaptively adjusted based on, for example, a channel signal quality such as a noise level specification.

66 Claims, 41 Drawing Sheets

U.S. PATENT DOCUMENTS

| | | | |
|---|---|---|---|
| 6,687,511 | B2 | 2/2004 | McGowan et al. |
| 6,741,661 | B2 | 5/2004 | Wheatley, III et al. |
| 6,845,082 | B2 | 1/2005 | Bourget et al. |
| 6,928,121 | B2 * | 8/2005 | MacFarlane Shearer et al. .......................... 375/267 |
| 6,999,522 | B2 * | 2/2006 | Shearer, III ................. 375/295 |
| 7,012,969 | B2 * | 3/2006 | Ode et al. .................... 375/296 |
| 7,099,399 | B2 * | 8/2006 | McCallister ................ 375/269 |
| 7,295,816 | B2 * | 11/2007 | McCallister ............ 455/114.2 |
| 7,342,976 | B2 * | 3/2008 | McCallister ................ 375/269 |
| 7,551,687 | B2 * | 6/2009 | Ode et al. .................... 375/296 |
| 2002/0191705 | A1 | 12/2002 | Melsa et al. |
| 2003/0043895 | A1 | 3/2003 | Melsa |
| 2003/0053562 | A1 | 3/2003 | Busson et al. |
| 2003/0063682 | A1 * | 4/2003 | Shearer, III ................. 375/295 |
| 2003/0063683 | A1 * | 4/2003 | MacFarlane Shearer et al. .......................... 375/295 |
| 2003/0086507 | A1 | 5/2003 | Kim et al. |
| 2004/0008795 | A1 | 1/2004 | Chu et al. |
| 2004/0100210 | A1 | 5/2004 | Hori et al. |
| 2004/0266369 | A1 | 12/2004 | McCallister |
| 2004/0266372 | A1 | 12/2004 | McCallister |
| 2005/0163248 | A1 * | 7/2005 | Berangi et al. .............. 375/296 |
| 2005/0226346 | A1 * | 10/2005 | Ode et al. .................... 375/296 |
| 2007/0055505 | A1 * | 3/2007 | Doclo et al. ................ 704/226 |

OTHER PUBLICATIONS

International Search Report of PCT/US2007/067388—Date of search: Aug. 28, 2008—2 pages.

Buswell et al., Design of Low Cost, High Performance RF Front-ends for Fixed Wireless Access Systems Using VOFDM, The Communications Edge.

Staudinger, Issues and Trends in Mobile Cellular Transmitter Power Amplification, Motorola.

R. W. Bauml, R. F. H. Fisher, and J.B. Huber, "Reducing the Peak-to-Average Power Ratio of Multi-Carrier Modulation by Selected Mapping," *Electron. Lett.*, vol. 32, No. 22, Oct. 1996, pp. 2056-2057.

R. van Nee and A. de Wild, "Reducing the Peak-to-Average Power Ratio of OFDM," Proc. IEEE VTC '98, May 1998, pp. 2072-2076.

T. May and H. Rohling, "Reducing the Peak-To-Average Power Ratio in OFDM Radio Transmission Systems," Proc. IEEE VTC '98, May 1998, pp. 2474-2478.

R. O'Neill and L.Lopes, "Envelope Variations and Spectral Splatter in Clipped Multi-carrier Signals," Proceedings of the PMRC '95, Sep. 1995, pp. 71-75.

J. Armstrong, "New OFDM Peak-to-Average Power Reduction Scheme," *IEEE VTC 2001*, May 2001, Rhodes, Greece.

J. Armstrong, "Peak-to-Average Power Reduction in Digital Television Transmitters," DICTA2002 Conference, Melbourne, Jan. 2002, pp. 19-24.

J. Armstrong, "Peak-to-Average Power Reduction for OFDM by Repeated Clipping and Frequency Domain Filtering," Electronics Letters, vol. 38, No. 5, Feb. 2002, pp. 246-247.

H.A. Suraweera, K. Panta, M. Feramez and J. Armstrong, "OFDM Peak-to-Average Power Reduction Scheme With Spectral Masking," Int'l Symposium on Comm. Systems Networks and Digital Processing (2004).

J. Armstrong, "PCC-OFDM with Reduced Peak-to-Average Power Ratio," in *IEEE 3Gwireless 2001*, May 30-Jun. 2, 2001, San Fransisco, pp. 386-391.

Ray Andraka, "A Survey of CORDIC Algorithms for FPGA-based Computers," Proceedings of the 1998 ACM/SIGDA Sixth International Symposium on Field Programmable Gate Arrays, Feb. 22-24, 1998, Monteray, CA, pp. 191-200.

M. Lampe and H. Rohling, "Reducing Out-of-Band Emissions Due to Nonlinearities in OFDM Systems," 49th IEEE Conference on Vehicular Technology, May 16-20, 1999, pp. 2255-2259.

S. Boyd, "Multi-tone Signals with Low Crest Factor," *IEEE Trans. Circuits Systems*, vol. 33, Oct. 1986, pp. 1018-1022.

D. Fraser, "Interpolation by the FFT Revisited—an Experimental Investigation," IEEE Transactions on Acoustics, Speech and Signal Processing, vol. 37, No. 5, May 1989, pp. 665-675.

B.M. Popovic, "Synthesis of Power Efficient Multitone Signals with Flat Amplitude Spectrum," *IEEE Trans. Commun.*, vol. 39, Jul. 1991, pp. 1031-1039.

X. Li and L. J. Cimini, "Effects of Clipping and Filtering on the Performance of OFDM", *IEEE Communications Letters*, vol. 2, No. 5, May 1998, pp. 131-133.

Y.S. Park, S.L. Miller, "The Peak-to-Average Power Ratio Suppression Schemes in DTF Based OFDM," IEEE VTC-2000, pp. 292-297.

K. Panta and J. Armstrong, "Use of Peak-to-Average Power Reduction Technique in HIPERLAN2 and its Performance in a Fading Channel," $6^{th}$ International symposium on DSP for Communication Systems, Sydney, Jan. 2002, pp. 113-117.

N. Ermolova, "A Comparison of Two Schemes for Peak-to-Average Power Ratio Reduction in a Multi-Carrier Transmission," Proc. IEEE ICCSC '02, Jun. 2002, pp. 102-105.

J. Armstrong, "Overcoming the Limitations of OFDM: Reducing Signal Peaks and Third Generation Modulation Techniques," invited presentation in *Australian Communications Theory Workshop 2003*, Melbourne, Australia, Feb. 5-7, 2003.

J. Armstrong, "Data Transmission and Reception in Multi-Carrier Modulation Systems," Patent Cooperation Treaty Application, May 1999, Publication No. WO 99/62207, available on WWW at http://gb.espacenet.com, Australian patent granted 2003.

J. Armstrong and M. Feramez, "Computationally Efficient Implementation of OFDM Peak-to-Average Power Reduction Technique", Proceeding of Third Internatinal Symposium, on Communication System, Networks and Digital Signal Processing, Stafford, Jul. 2002, pp. 236-239.

Kusha Panta and J. Armstrong, "The Performance of Overlap PCC-OFDM with Error-Correcting Codes," $6^{th}$ International Symposium on DSP for Communication Systems, Sydney, Jan. 2002, pp. 118-122.

Luqing Wang et al., "A Simplified Clipping and Filtering Technique for PAR Reduction in OFDM Systems", IEEE Signal Processing Letters, vol. 12, No. 6, pp. 453-456 (Jun. 2005).

Lashkarian, N. et al., "Peak to Average Power Ratio Reduction in multi-band Transmitters; Analysis, Design and FPGA Implementation", Signal Processing Systems Engineering Xilinx Inc., IEEE Globecom 2005, pp. 2169-2173.

* cited by examiner $\alpha_k$ = target EVM value
$S_k$ = $k^{th}$ channel signal
$X_k$ = $k^{th}$ channel excursion
$P_{sk}$ = $S_k$ power = $S_k S_k^*$
$P_{xk}$ = $X_k$ power = $X_k X_k^*$
$AP_{xk}$ = Max allowed $X_k$ power
MinG = Minimum channel gain
$N_k$ = residual (linear & nonlinear) distortion noise power
$AMR_k$ = allowed-to-measured 'peak-reduction' noise power ratio in $k^{th}$ channel = $AP_{xk} / P_{xk}$

METHOD AND APPARATUS FOR ADAPTIVELY CONTROLLING SIGNALS

CROSS-REFERENCE TO RELATED APPLICATIONS

This application is a divisional of co-pending application Ser. No. 11/417,477, filed Apr. 27, 2006 to which priority under 35 U.S.C. §120 is claimed, the entire contents of which are incorporated herein by reference.

FIELD OF INVENTION

This invention relates generally to signal transmission systems, including those associated with cellular infrastructure, where signal peaks may be advantageously reduced, and more particularly to a method and apparatus for reduction of peak power requirements by adaptively controlling signals.

BACKGROUND OF THE INVENTION

Wireless communication basestations, networks, and other systems use power amplifiers to transmit signals to cellular phones, handheld messaging devices, computers, personal electronic assistants, and other devices. A power amplifier increases the average power of the transmitted wireless signal sufficiently to maintain a reliable communication link at any required distance. This is necessary because signal waveforms are used to efficiently convey information between a transmitter and a distant receiver. Since noise and interference are combined with the signal waveform at the receiver, the transmitter must amplify its waveform prior to transmission sufficiently to guarantee that the ratio of received signal energy to noise/interference energy exceeds a specified value; otherwise the receiver's additive noise/interference can overwhelm the signal energy, resulting in loss of information over the data link. This constraint applies to communication systems employing wireless transmission, including radio frequency (RF), optical and audio technologies.

Pre-transmission amplification of the information-bearing signal waveform constitutes one of the major costs associated with modern information transfer. FIG. 1 depicts a typical relationship between amplification cost and the maximum (peak) magnitude of the signal waveform. Package cost generally dominates for low peak-power amplifiers. However, beyond some point, additional peak-power capability results in exponentially-increasing amplifier costs. For this reason, signal processing techniques capable of reducing peak values of the transmitted waveform are greatly valued in modern wireless signal transmission systems.

The transmitted signal's power varies depending on both the modulation type and the data sequence being transmitted, which results in peaks and troughs in the instantaneous power as a function of time. The complexity and cost of an amplifier is highly dependent on the maximum instantaneous power it must accommodate. Consequently, basestation providers and operators and other electronics users seek ways to lower the instantaneous or "peak" power requirements of the relevant system.

To reduce system peak power requirements, a provider may simply limit the maximum amplifier output power by constraining or "clipping" the maximum magnitude of the amplifier's output signal. Clipping the amplifier output effectively reduces the peak power output requirement while still providing ordinary amplification for non-peak signals. Since the cost of a power amplifier rapidly increases as it is required to accommodate higher peak power levels, clipping can significantly reduce system cost. Clipping may be particularly attractive in applications in which large peaks occur only occasionally. For example, a single amplifier often simultaneously amplifies signals for multiple channels. Occasionally, the multiple channel signals constructively combine to generate a relatively high peak. The amplifier must either fully amplify the peak, requiring an expensive high peak-power amplifier, or the output magnitude may be clipped to facilitate the use of a lower peak-power, less expensive amplifier.

In wireless communications and networking, however, clipping is unacceptable. Clipping induces spectral regrowth, creating spectral energy in potentially restricted spectral regions. The electromagnetic spectrum is a finite resource, and it is strictly apportioned by restrictions from various governmental regulating agencies to minimize interference from competing users. The various spectrum users receive permission to transmit within certain bandwidths and are ordinarily prohibited from transmitting outside of the designated bandwidth. Even within the so-called "unlicensed bands", strict FCC standards regulate spectral emissions to minimize interferences. Because spectral regrowth adds unacceptable frequency components to the signal, spectrum regulations do not permit clipping as a solution for high-power amplifier requirements.

The relationship between signal peaks and amplifier characteristics is of great significance with respect to wireless communications. Efficient power amplifiers exhibit an intrinsically nonlinear relationship between input and output power. The relationship between amplifier input and output power is depicted in the lower curve 240 of FIG. 2. For low levels of input power, the amplifier output signal is essentially a linearly-amplified replica of the input. However, at higher input signal power levels, the amplifier output reaches an upper limit, the amplifier saturation power, which cannot be exceeded. The region of the amplifier curve near the saturation point is nonlinear. Operation of the amplifier near its nonlinear amplification region generates unacceptable nonlinear noise which violates regulatory spectral masks, forcing operation at a lower input power level. Prior art includes numerous techniques which can be used to 'linearize' an amplifier, thus mitigating the nonlinear characteristic, and approaching the ideal linear relationship shown in the upper curve 242 in FIG. 2.

Amplifier nonlinearities convert input signal energy into nonlinear spectral energy which may violate regulatory spectral mask constraints. It is therefore necessary to limit the strength of the signal input to the amplifier so that its magnitude only rarely extends beyond the linear region of operation. As FIG. 2 shows, the value of amplifier linearization is that it can greatly extend the upper limits of the amplifier's linear region. After the amplifier has been linearized to the practical limit, generation of unwanted nonlinear spectral components may be further reduced by limiting the likelihood that the signal magnitude extends beyond the amplifier's linear region. This reflects the important fact that generation of unwanted nonlinear components requires that signal peaks extend beyond the amplifier's linear region; both signal and amplifier characteristics are involved, and both must be addressed.

The need for peak-reduction processing was greatly increased by the relatively recent widespread adoption of so-called 'multi-channel' signal waveforms for wireless infrastructure systems. The adoption of multi-channel signaling (MCS) occurred because of the strong economic incentive to combine several independent signal waveforms wherein all of the signals are transmitted in the same spatial direction and all signals can then share a single antenna. Previously, infrastructure basestations separately amplified each waveform, which were then combined using a 'diplexer' before sending the composite amplified signal to the antenna. However, since a four-signal high-power diplexer can cost on the order of $10,000, an alternative solution in the form of MCS was developed. In MCS, several independent signal waveforms are generated and combined while still in digital form. The combined signals then share a common frequency translation to RF, a common amplifier and a common antenna. The heavy, bulky, and expensive diplexer is eliminated. The digital channel waveforms remain separated by the inter-channel frequency spacing, typically less than ten megahertz, so that inexpensive (relatively low rate) digital processing can easily generate the composite waveform. FIG. 3 depicts the baseband complex spectra associated with four adjacent cellular signals. Note that the frequency offsets correspond only to the relative transmission frequencies, since the common RF frequency translation will be added to the MCS waveform after it has been converted into analog form. While MCS provides an economically advantageous solution to the diplexer problem associated with earlier transmission systems, MCS greatly aggravates the peak magnitude problem, since the signal peak of an MCS waveform is much higher than that of each of its component signal waveforms. Thus, MCS remains an incomplete solution to the diplexer problem of earlier transmission systems until peak reduction in MCS is effectively addressed.

In addition to the emergence of MCS waveforms with their large peak magnitudes, several important worldwide wireless standards [e.g. 802.11 (WiFi) and 802.16 (WiMAX)] have adopted orthogonal frequency-division multiplexing (OFDM) waveforms which use parallel transmission of many narrowband components. An OFDM signal may be considered as a special case of multi-channel transmission, with no spectral spacing between adjacent channels, and short burst (rather than continuous) transmission. The WiMAX waveform, which has been proposed as a potential worldwide solution for all wireless communication, uses basestation transmissions consisting of OFDM with several hundred channels. These channels are allocated to many users, with modulation types and power levels of those sets of channels sent to each user selected based on the path attenuation for each distinct physical link. The large peak power level variation of the many OFDM channels generates peak-reduction demands similar to those of MCS. OFDM must also satisfy stringent error vector magnitude (EVM) constraints for each set of channels allocated for each individual user, in the face of dynamically-varying channel modulation orders, path losses, and signal power levels. Peak-reduction processing therefore offers economic advantages to modern wireless communication systems, both RF and optical, both MCS and OFDM, as well as any other system in which signal peaks are beneficially reduced based on any standard, requirement or economic factor including, for example, digital radio and television broadcast systems.

Numerous technical papers directed to techniques for peak-reduction processing have been published, and several patents have been awarded, as would be expected for such an economically vital challenge.

One peak-reduction processing approach simply modifies the information stream itself prior to the signal generation (modulation) operation. See, e.g., R. W. Bauml, R. F. H. Fisher, and J. B. Huber, "Reducing the Peak-to-Average Power Ratio of Multi-Carrier Modulation by Selected Mapping," *Electron. Lett.*, vol. 32, no. 22, October 1996, pp. 2056-2057; R. van Nee and A. de Wild, "Reducing the Peak-to-Average Power Ratio of OFDM," Proc. IEEE VTC '98, May 1998, pp. 2072-2076. While this technique reduces the peaks, it also significantly degrades the performance of error-correction coding, and has thus failed to find any significant market acceptance.

Other approaches generate/modulate the information stream onto the waveform, then alter that waveform to reduce its peak magnitude. See, e.g., T. May and H. Rohling, "Reducing the Peak-To-Average Power Ratio in OFDM Radio Transmission Systems," Proc. IEEE VTC '98, May 1998, pp. 2474-78. One such approach applies localized smoothly-varying attenuation to the signal in the vicinity of each peak. Yet another approach avoids generating nonlinear noise by simply subtracting suitably scaled band-limited pulses from the signal to cancel each peak. While these approaches offer improvement, and at least two patents (U.S. Pat. Nos. 6,366,319 and 6,104,761) have been granted for such an approach, they both add excessive noise to the signal. These approaches also do not offer a comprehensive and systematic peak-reduction processing solution when the MCS channels are dynamically varying in relative power levels and when the EVM requirements of each channel also dynamically vary, as is the case with real-world MCS transmission.

Still another technique is the classic clip-and-filter approach, which simply passes the waveform through a "clipper" (i.e. hard-limiter), then filters the clipped to ensure compliance with regulatory spectral constraints. This approach is very commonly used for peak-reduction of OFDM signals. e.g., R. O'Neill and L. Lopes, "Envelope Variations and Spectral Splatter in Clipped Multi-carrier Signals," Proceedings of the PMRC '95, September 1995, pp. 71-75; J. Armstrong, "New OFDM Peak-to-Average Power Reduction Scheme," *IEEE VTC* 2001, May 2001, Rhodes, Greece; J. Armstrong, "Peak-to-Average Power Reduction in Digital Television Transmitters," DICTA2002 Conference, Melbourne, January 2002, pp. 19-24; J. Armstrong, "Peak-to-Average Power Reduction for OFDM by Repeated Clipping and Frequency Domain Filtering," Electronics Letters. vol. 38, No. 5, February 2002, pp. 246-47; U.S. Patent Publication Nos. 2004/0266372, 2004/0266369; H. A. Suraweera, K. Panta, M. Feramez and J. Armstrong, "OFDM Peak-to-Average Power Reduction Scheme With Spectral Masking," Int'l Symposium on Comm. Systems Networks and Digital Processing (2004). The prior art in this area does nothing more than filter away out-of-band (OOB) energy. However, hard-limiting in this manner introduces passband nonlinear interference which cannot be removed by out-of-band filtering, and even out-of-band DFT filtering distorts the signal.

A conceptually-related peak reduction technique involves determining the 'excursion' (the portion of the signal exceeding a defined magnitude threshold), then filtering, scaling and time-aligning the excursion prior to subtracting it from a suitably delayed version of the original signal. This 'filtered excursion' approach eliminates signal distortion by applying filtering only to the excursion. The advantage is that spectral constraints are met without generating signal distortion, and peaks can be reduced by the maximum amount permitted by spectral constraints. The only prior art description of the filtered excursion approach, J. Armstrong, "PCC-OFDM with Reduced Peak-to-Average Power Ratio," in *IEEE 3Gwireless* 2001, May 30-Jun. 2, 2001, San Francisco, pp. 386-391, is limited to a non-standard variant of OFDM that involves overlapped symbols. The author has notably described clip-and-filter as the preferred peak-reduction approach for standard OFDM signals in all subsequent publications.

This 'filtered excursion' approach forms the theoretical basis for the present invention as described and claimed below, but the present invention goes beyond prior approaches in several significant respects. The prior art relating to the filtered excursion approach to peak-reduction processing properly recognized the need for interpolation prior to forming the excursion signal, although claiming, incorrectly, that over-sampling by a factor of only two was required. An increased sampling rate prevents nonlinear spectral components associated with the excursion from aliasing back into the spectrum occupied by the original signal. This is important because once such nonlinear components occur, they cannot be removed by filtering. However, the prior art failed to recognize several critical factors involved in achieving optimal peak reduction. For example, the prior art did not recognize the need to vary the attenuation-versus-frequency characteristic of the excursion filtering across the signal passband in order to properly protect the weaker signal components. The prior art described only static frequency-dependent attenuation of the out-of-band excursion spectral components, and pointedly instructed to "distort the in-band (i.e. passband) component of the difference (excursion) as little as possible." However, the nonlinearity represented by excursion formation generates relatively uniform spectral nonlinearity noise across the signal bandwidth. Ensuring that all portions of the signal satisfy a minimal signal-to-noise ratio (SNR) constraint thus requires that extra attenuation be applied to the excursion in those spectral regions of weaker signal spectral energy. Even more critically, since the relative spectral energy of different signals varies dynamically, any such signal-responsive filtering must be dynamically adapted over time. Finally, each portion of a multi-channel signal must independently satisfy the error vector magnitude (EVM) constraint, which limits each distinct channel's SNR to one of a set of defined values, depending on that channel's modulation type. The cited prior art failed to recognize the need to dynamically adapt the signal passband 'filtering' in order to satisfy this critical specification. Finally, the prior art failed to grasp the critical importance of applying dynamic scaling to different portions of the excursion prior to filtering in order to achieve significantly enhanced peak-reduction. An object of the present invention is thus to provide gain and other control strategies for optimizing peak reduction subject to noise level (for example EVM) constraints, signal dynamics and residual linear and nonlinear distortion energy considerations.

SUMMARY OF THE INVENTION

A signal processing system for use in, for example, a communication and/or amplifier system, according to various aspects of the present invention includes an excursion signal generator and a filter system. The excursion signal generator identifies a peak portion of a signal exceeding a threshold, such as a magnitude threshold. Distinct portions of the excursion waveform are dynamically scaled to enhance peak reduction. The filter system filters a corresponding excursion signal having a magnitude and waveform corresponding to the portion exceeding the threshold to remove unwanted frequency components from a scaled version of the excursion signal. The filtered excursion signal may then be subtracted from a delayed version of the original signal to reduce the peak. In one embodiment, the signal processing system adapts to varying channel power levels by adjusting the magnitude threshold. The signal processing system may also adjust the scale of the excursion signal and/or individual channel signals, such as to meet constraints on channel noise and output spectrum, or to optimize peak reduction. In other embodiments, the magnitude threshold, excursion signal and/or individual channel signals may also be adaptively adjusted based on, for example, a channel signal quality such as a noise level specification.

BRIEF DESCRIPTION OF THE DRAWING FIGURES

A more complete understanding of the present invention may be derived by referring to the detailed description when considered in connection with the following illustrative figures. In the following figures, like reference numbers refer to similar elements and steps.

Figure 19:
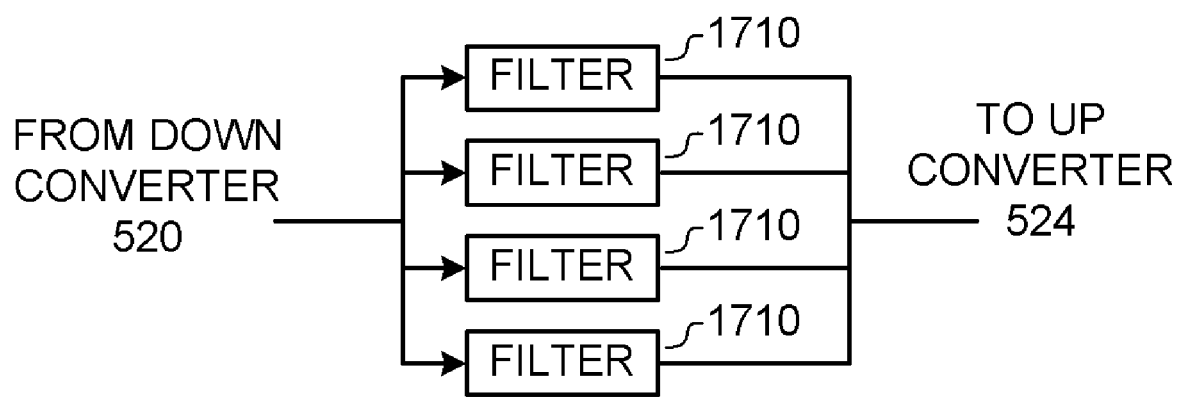
Figure 20:
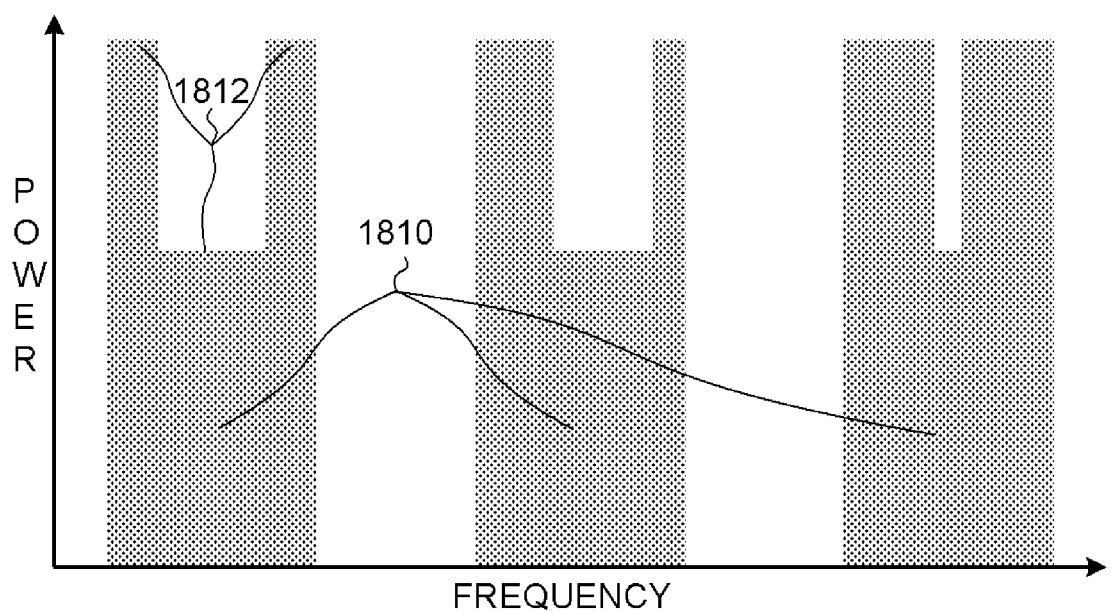
Figure 21:
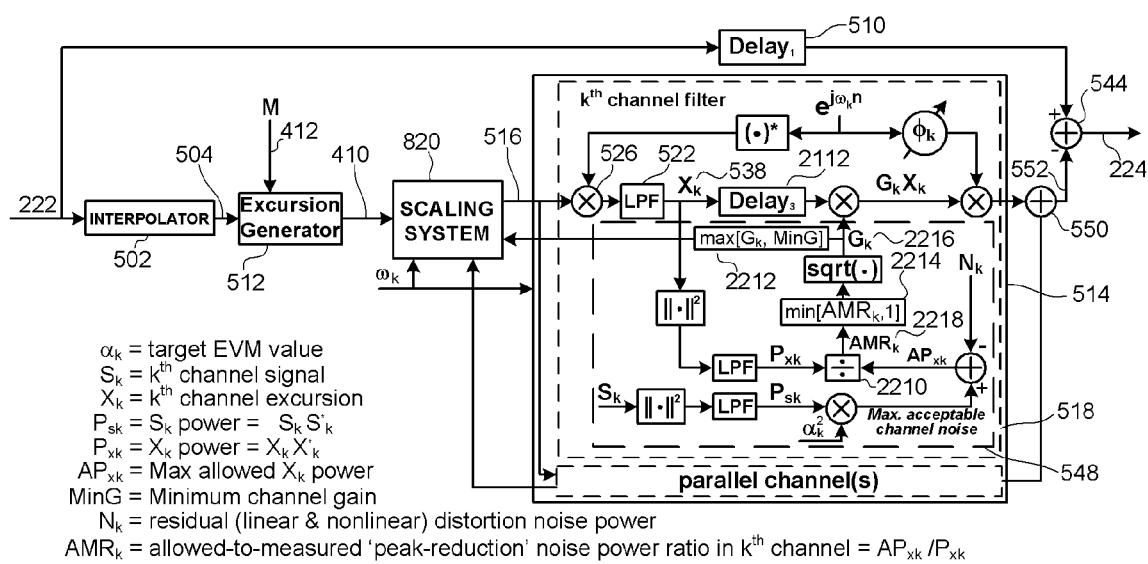
Figure 22:
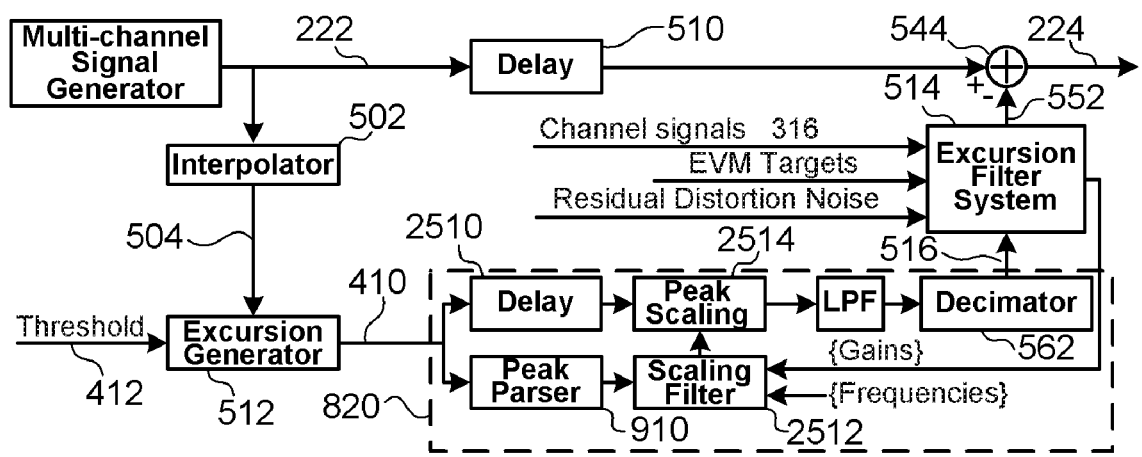
Figure 23:
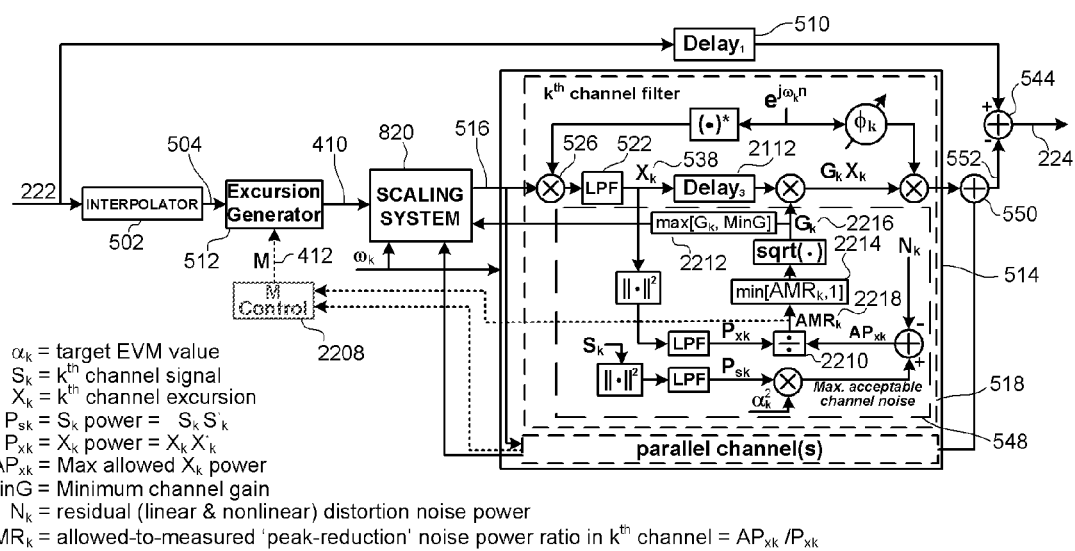
Figure 24:
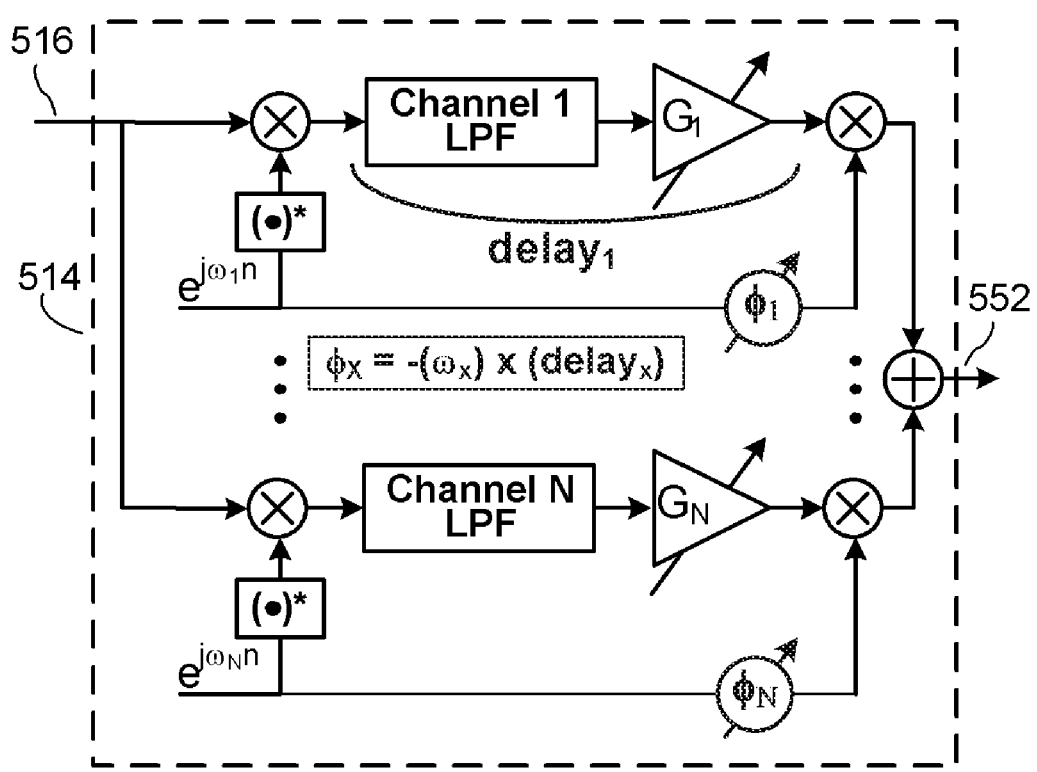
Figure 25:
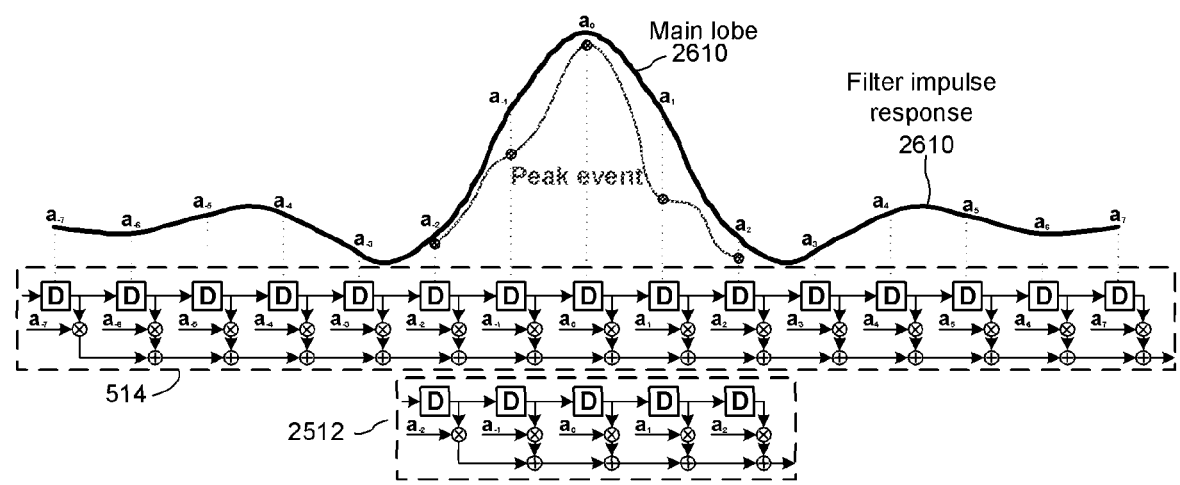
Figure 26:
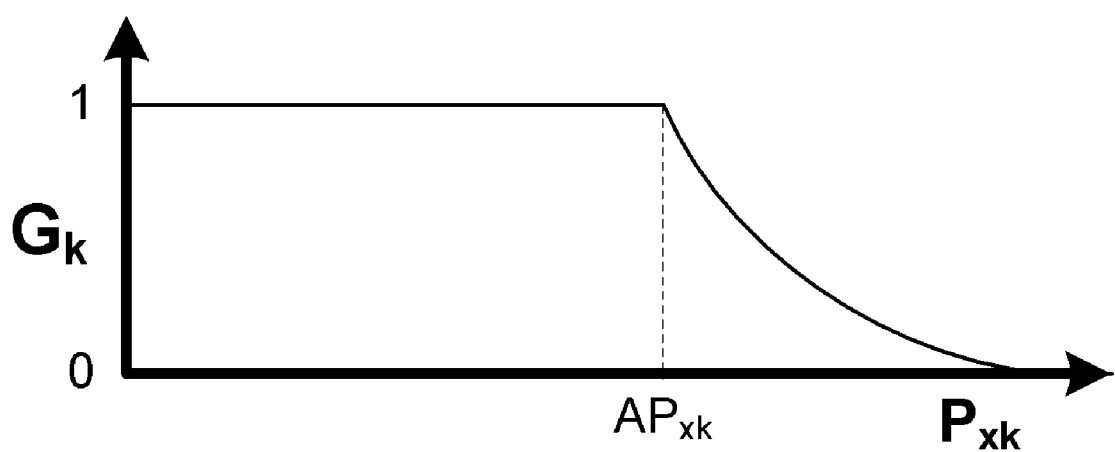
Figure 27:
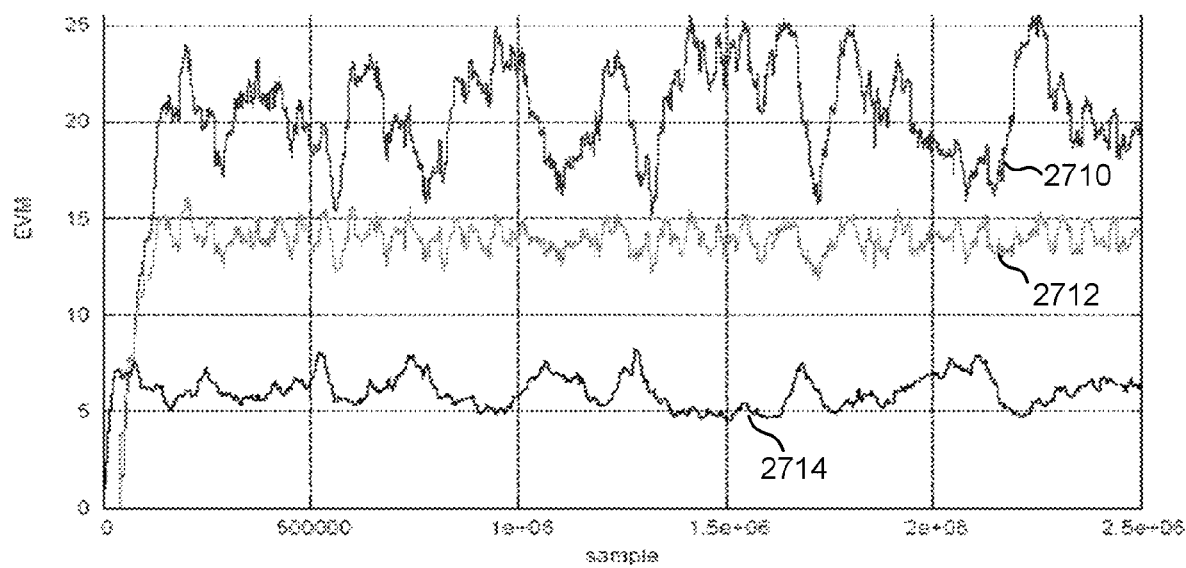
Figure 27A:
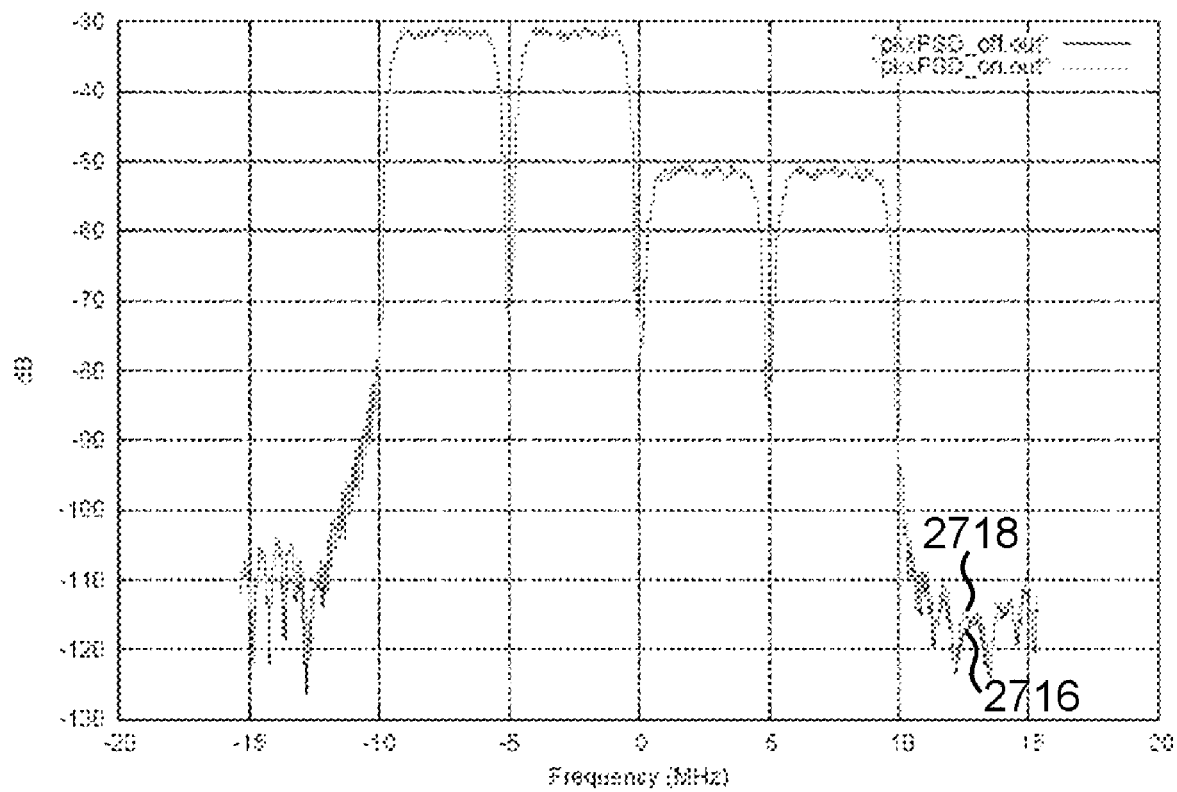
Figure 27B:
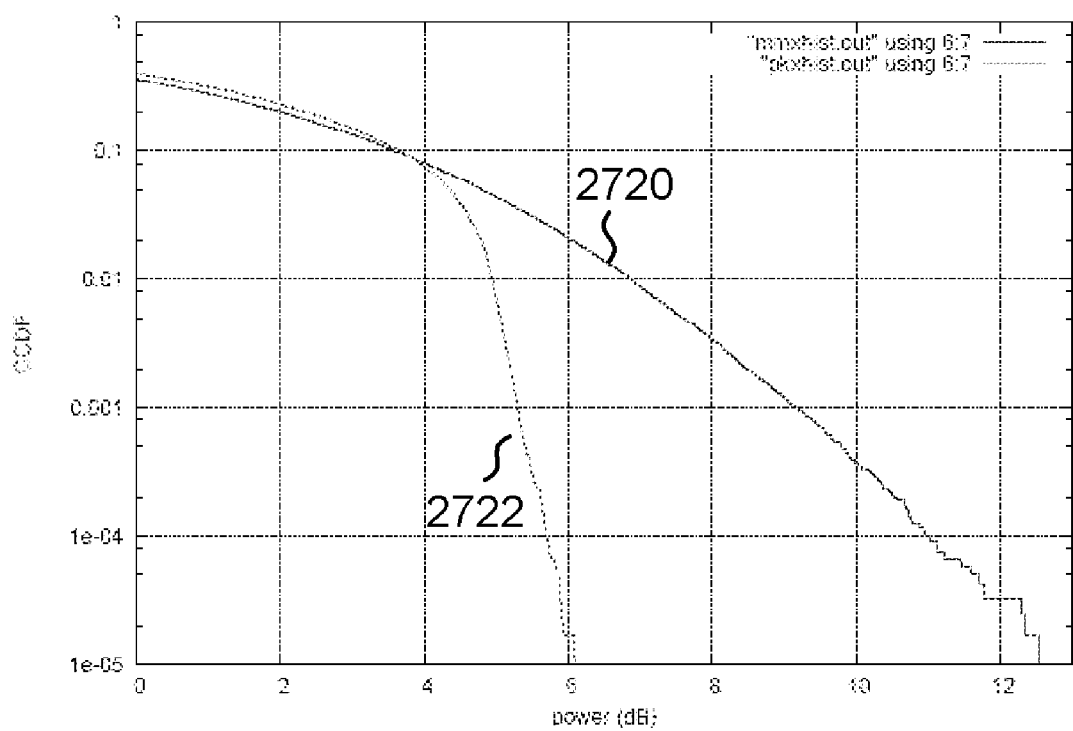
Figure 27C:
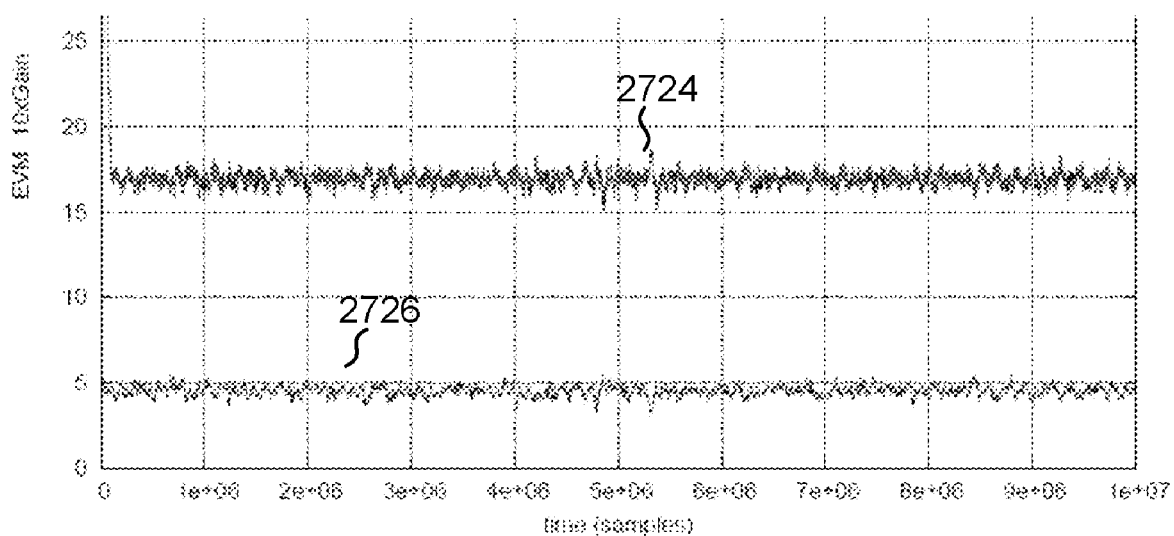
Figure 27D:
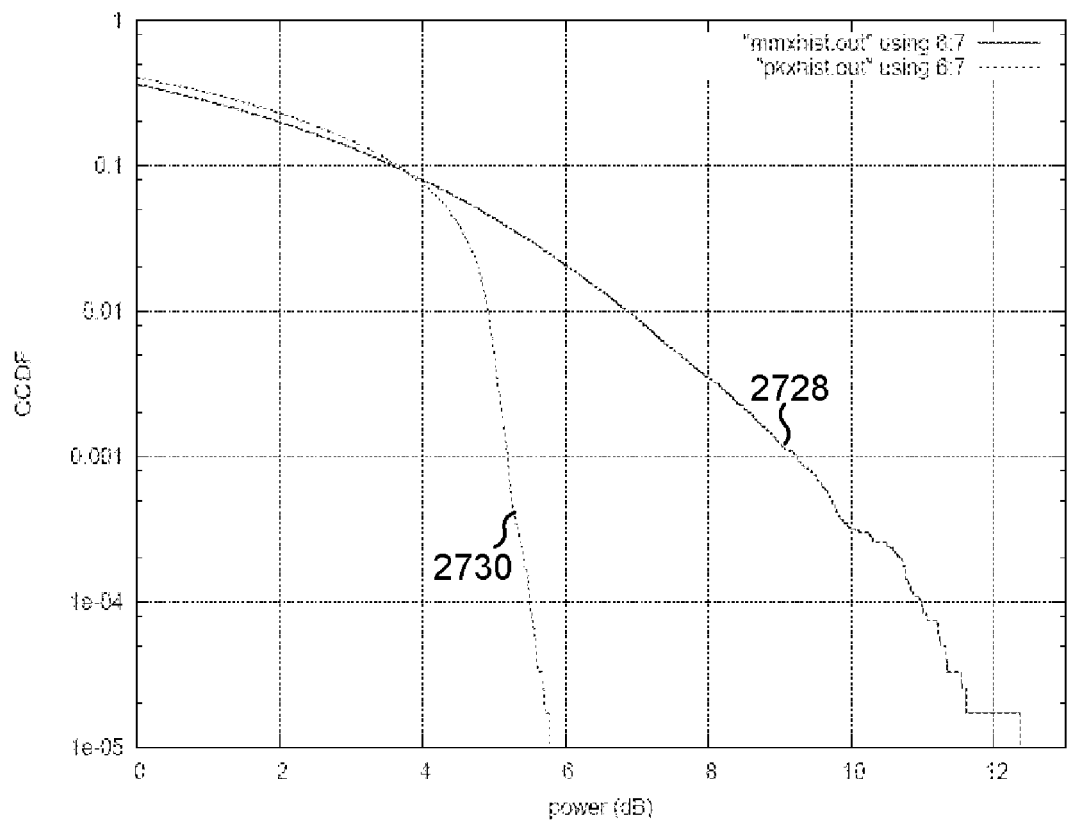
Figure 27E:
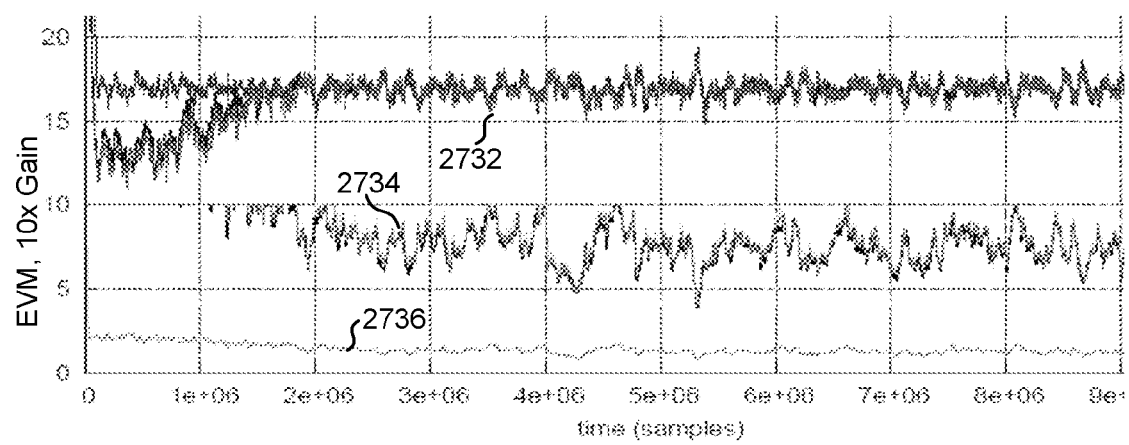
Figure 27F:
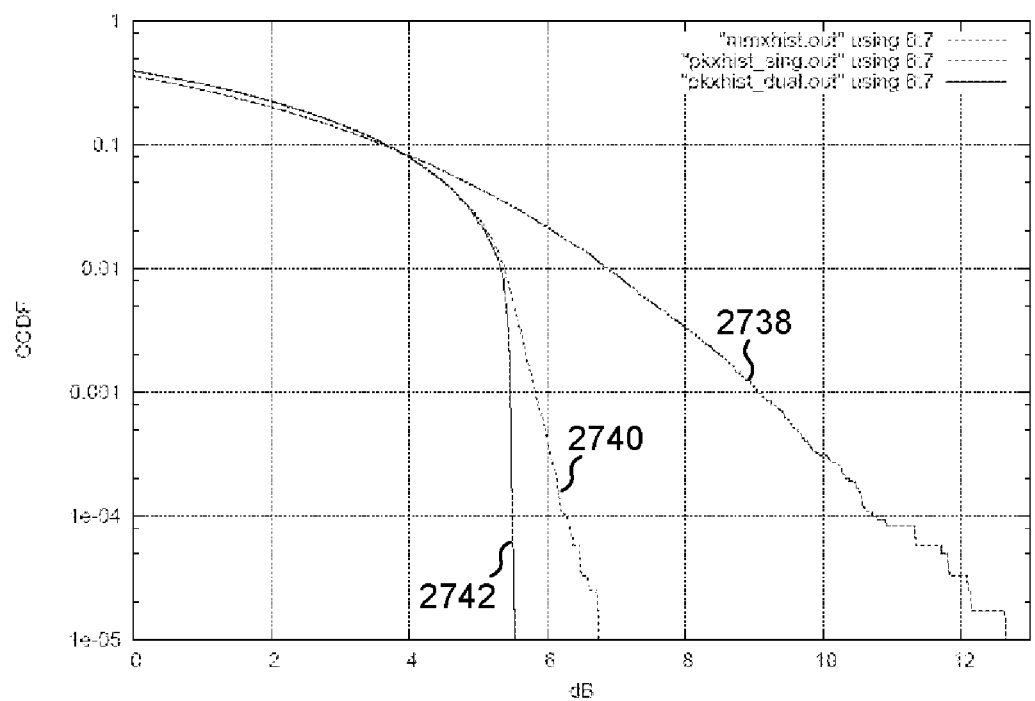
Figure 28:
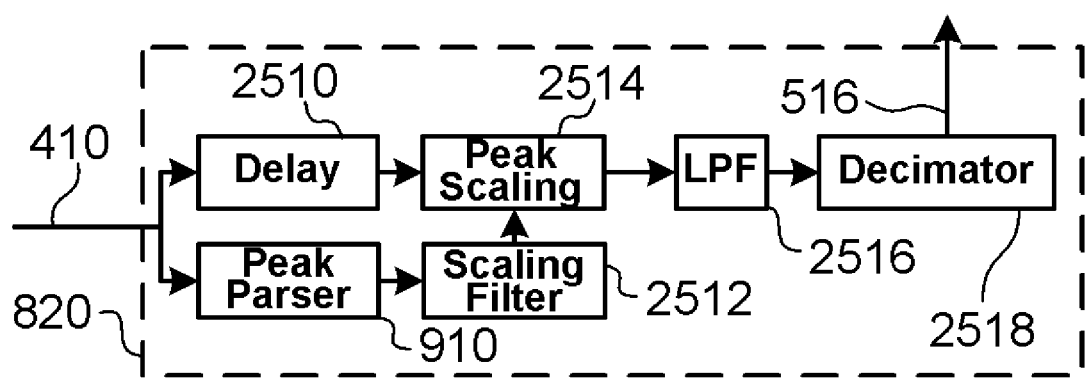
Figure 29:
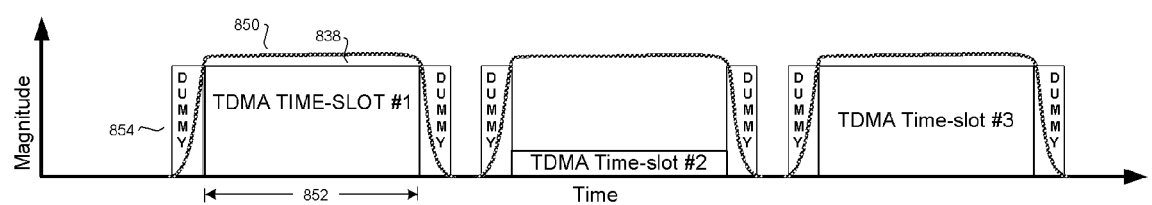
Figure 30:
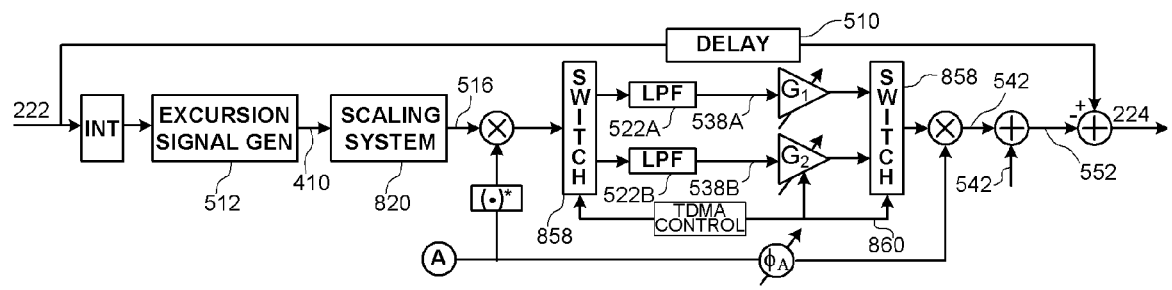
Figure 31:
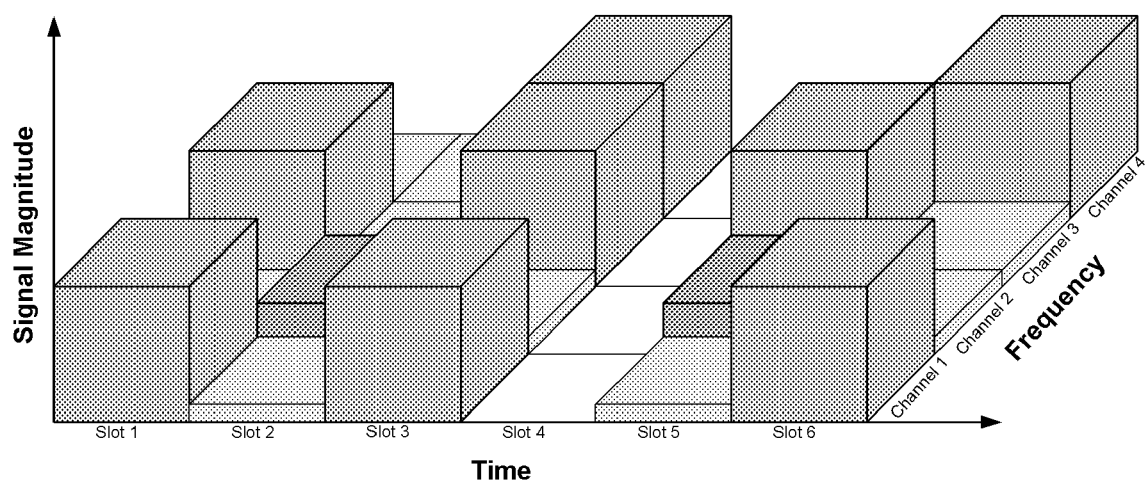
Figure 32:
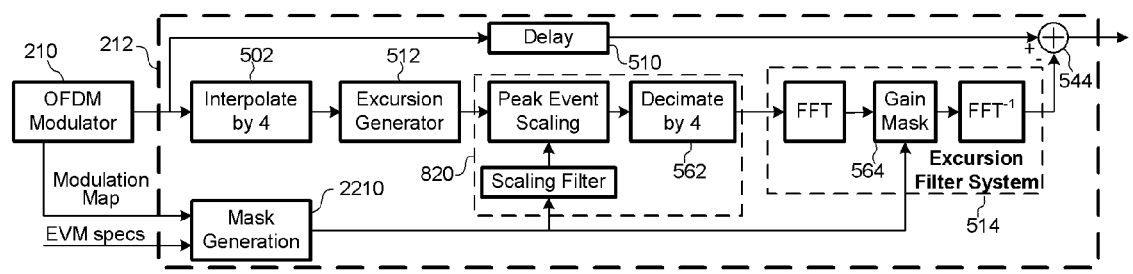
Figure 33:
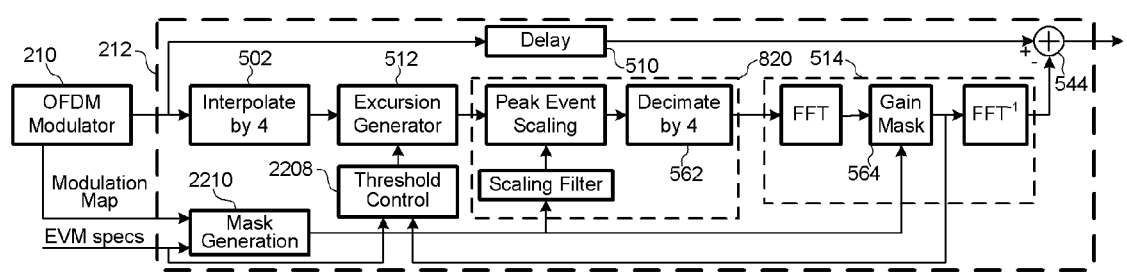

FIGS. 18 A-C are frequency diagrams for a signal processed by a filter system;

FIG. 19 is a diagram of a channel filter for filtering subchannels;

FIG. 20 is a magnitude diagram of a signal comprising multiple channels having subchannels;

FIG. 21 is a schematic of a detailed peak-reduction processing algorithm and architecture including an exemplary channel scaling circuit;

FIG. 22 illustrates a peak-reduction processing architecture;

FIG. 23 is a schematic of a detailed peak-reduction processing algorithm and architecture including an exemplary channel scaling circuit and circuitry for adaptively varying the signal magnitude threshold;

FIG. 24 shows a functional architecture for a typical excursion filter system 514;

FIG. 25 is a schematic representation of an excursion filter, a corresponding scaling filter, and their respective impulse responses;

FIG. 26 is a plot describing the desired variation in the gain within each channel filter 518 as a function of the filtered excursion power from each excursion filter channel;

FIG. 27 is an illustrative plot showing gain-controlled EVM dynamics corresponding to the algorithm and architecture of FIG. 21;

FIG. 27A is an illustrative plot showing the negligible spectral impact of EVM-controlled gain using the algorithm and architecture of FIG. 21;

FIG. 27B shows a raw and peak-reduced CCDF plot for a combination of four strong channels corresponding to the algorithm and architecture of FIG. 23;

FIG. 27C shows a plot of channel gains and EVM values versus time corresponding to the CCDF plot of FIG. 27B;

FIG. 27D shows a raw and peak-reduced CCDF plot for one weak channel and three strong channels corresponding to the algorithm and architecture of FIG. 23;

FIG. 27E shows a plot of channel gains and EVM values versus time corresponding to the CCDF plot of FIG. 27D;

FIG. 27F shows an improved CCDF plot achieved using cascaded peak reduction;

FIG. 28 is a block diagram of a scaling system having an approximation/scaling filter;

FIG. 29 is a TDMA waveform diagram of a sequence of time slots and a time slot windowing signal;

FIG. 30 is a block diagram of a filter system having additional filters and a switching system;

FIG. 31 shows the magnitude of a TDMA signal comprising multiple channels transmitted in a series of time slots;

FIG. 32 is a block diagram of an OFDM peak-power reduction component having an interpolator, a decimator, fast Fourier transforms (FFTs), and peak-event scaling, that shows mask generation based on channel-specific signal power and EVM constraints; and FIG. 33 is a block diagram of an OFDM peak-power reduction component having an interpolator, a decimator, fast Fourier transforms (FFTs), peak-event scaling, mask generation based on channel-specific signal power and EVM constraints, and adaptive control of the magnitude threshold.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The peak-reduction concepts of the present invention as discussed below are presented primarily in the context of MCS (typically four WCDMA channels), since it simplifies the discussion to treat a smaller number of signal channels. However, the peak-reduction processing concepts of the present invention are equally applicable to OFDM signals. Similarly, the discussion below is presented in the context of wireless communications systems. However, the peak-reduction processing concepts of the present invention are equally applicable to, for example, digital radio and television broadcast systems, including wired, terrestrial and satellite broadcast systems. The invention may, for example, provide benefits in the processing of any signal conveyed via variations in electromagnetic or acoustic fields. The inventive concepts may therefore be applied in optical data transmission and audio systems. The present invention thus includes within its scope the processing of signals, or apparatus therefor, in any system in which signal peaks may be advantageously reduced based on or pursuant to any standard, requirement or economic factor.

Figure 4:
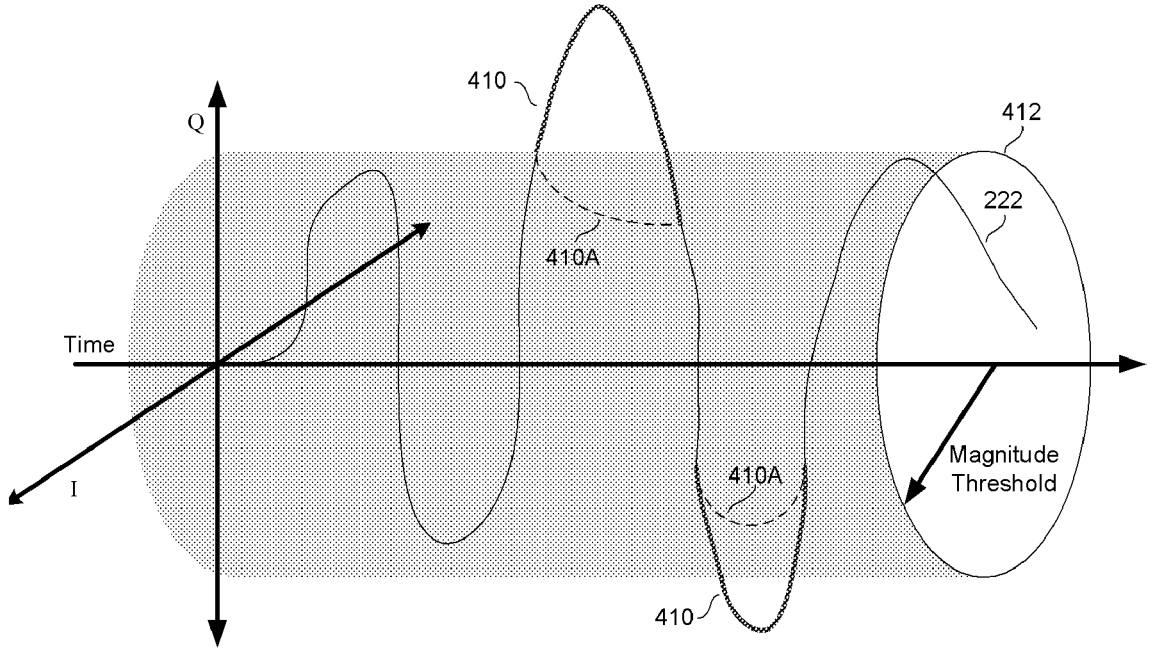
FIG. 4 is an illustration of a complex signal over time and a magnitude threshold.

In the following discussion of the peak-reduction concepts of the present invention, the signal is assumed to be represented by a sequence of complex (i.e. quadrature) samples that uniquely describe the signal's instantaneous magnitude and phase as these values dynamically evolve over time. The random information borne by the signal results in random dynamic variations in signal phase and magnitude. FIG. 4 depicts such a signal as a time-varying trajectory. The cylindrical surface feature in FIG. 4 simply corresponds to a defined constraint on signal magnitude (the 'threshold'). Occasionally, the magnitude exceeds the threshold; in FIG. 4 the extra-cylinder portion 410 of the signal 222 is illustrative of the portion of the signal which exceeds the threshold 412.

With reference to FIG. 4, the 'clipped signal' is that portion of the signal lying entirely within, or on, the cylinder, with the portion exterior to the cylinder replaced by its projection 410A onto the cylinder. The clipped signal magnitude is bounded by the threshold value; its phase is always identical to the original (unclipped) signal. This constraint on signal magnitude can be expressed mathematically as follows:

$$C(n) \equiv \begin{cases} S(n) & \forall_n \_\|S(n)\| \le M \\ M\left[\dfrac{S(n)}{\|S(n)\|}\right] & \forall_n \_\|S(n)\| > M \end{cases}$$

Where C(n) is the clipped signal, S(n) is the unclipped signal, $\|S(n)\|$ is the magnitude of the unclipped signal, M is the magnitude threshold and $\forall_n\_\|S(n)\|$ means "for all values of n such that the magnitude of S(n)." Each signal segment 410 outside the cylindrical surface is defined as an excursion event X(n):

$$X(n) \equiv S(n) - C(n)$$

Figure 5:
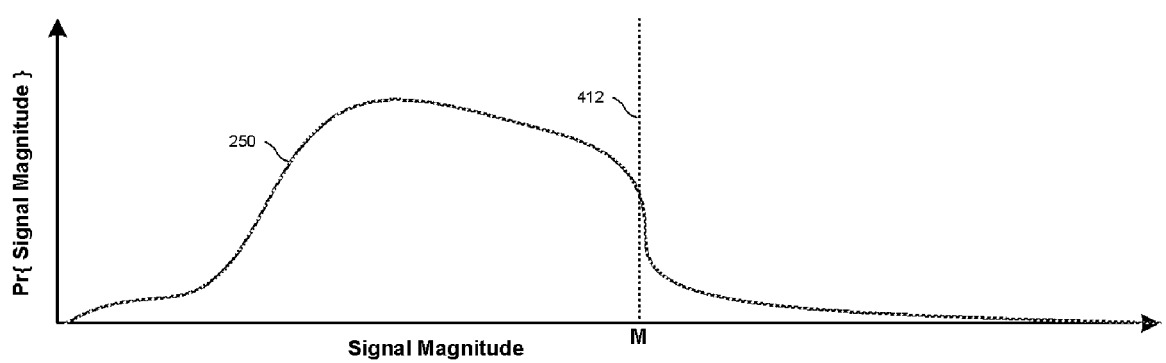
FIG. 5 shows an exemplary signal magnitude probability density function (pdf)

Variation in signal magnitude can be quantified statistically. FIG. 5 is a schematic representation of the so-called magnitude probability density function (pdf) for a typical signal. Note that the magnitude pdf 250 exhibits a very long tail (along the Signal Magnitude axis), implying that very large values of signal magnitude can occur, albeit with declining likelihood as the signal magnitude gets larger. The purpose of peak-reduction processing is to alter the signal in a manner which eliminates or substantially reduces the probability that the signal magnitude will exceed some defined (threshold) value. To totally eliminate the possibility that the signal magnitude will exceed such a threshold value would have the effect of modifying the magnitude pdf from that depicted in FIG. 5 to that depicted in FIG. 6. The vertical dashed line 412 of FIG. 5 represents the magnitude threshold value. The increase in probability near the magnitude threshold in FIG. 6 as compared to FIG. 5 is a result of the fact that the area under the pdf curve must equal unity. The impact of a peak-reduction algorithm must therefore be able to transfer the tail (above the magnitude threshold) back into the body of the pdf (below the magnitude threshold). MCS magnitude pdfs exhibit extremely long tails like that shown in FIG. 5, which illustrates why MCS remains an incomplete solution to the diplexer problem discussed above until peak-reduction is effectively addressed.

Figure 6:
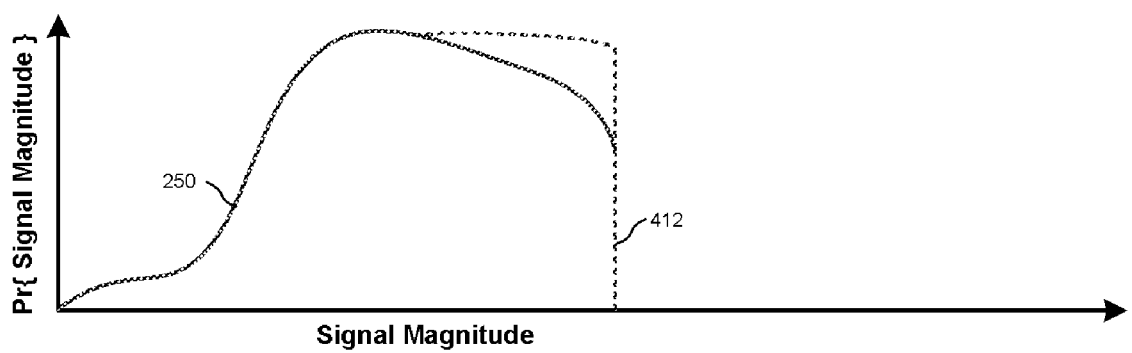
FIG. 6 shows an exemplary peak-reduced signal magnitude probability density function.
Figure 7:
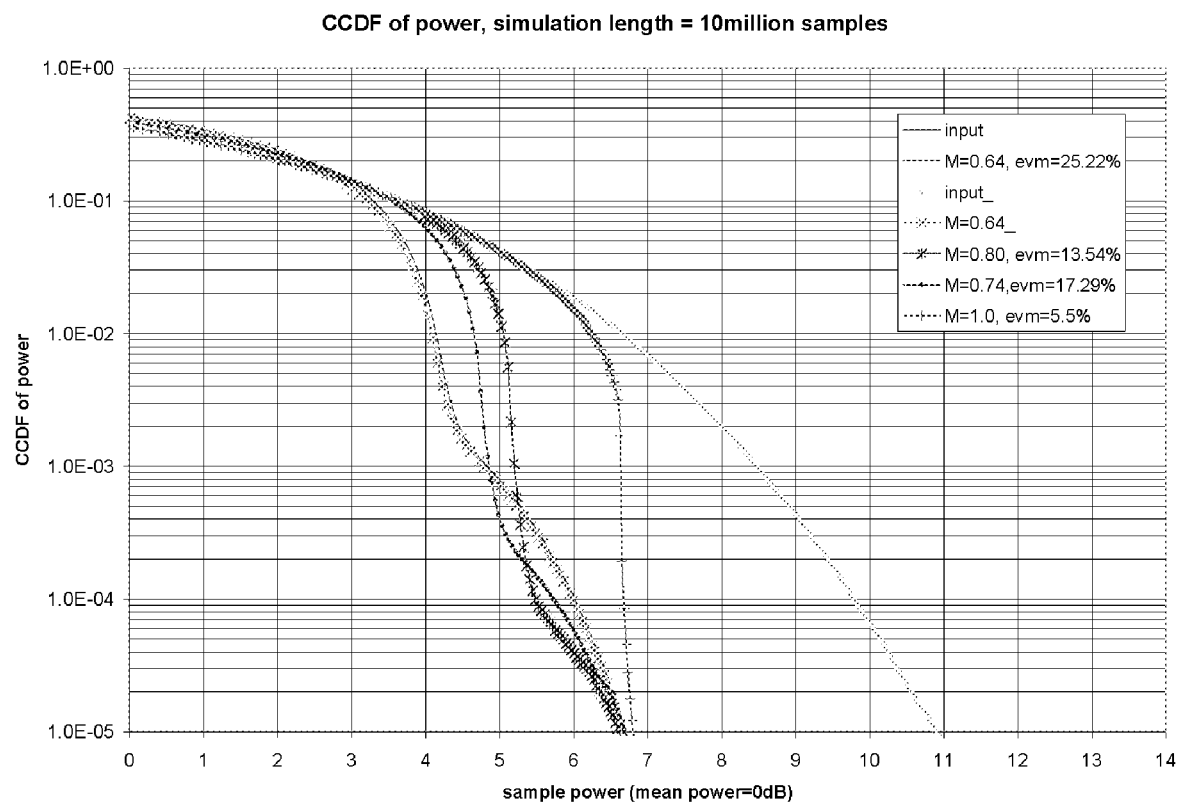
FIG. 7 depicts complementary cumulative distribution function (CCDF) curves corresponding to four wideband code-division multiple access (WCDMA) channels using various values for the magnitude threshold.

Therefore, as can be appreciated from FIGS. 5 and 6, an important function of peak-reduction processing is to reduce the likelihood of large signal magnitudes. The communications industry commonly uses the statistical metric known as the Complementary Cumulative Probability Density Function (CCDF) plot to more clearly characterize the effectiveness of peak-reduction processing. The x-axis (horizontal) of a CCDF curve begins at 0 dB (defined as the average power of the signal), and extends to the maximum peak-to-average power ratio (PAR) value of the signal. The y-axis (vertical) of a CCDF curve lists the probability (on a log scale) that a given complex sample has any specific peak-to-average value. Plotting the before and after CCDF curves on the same graph characterizes the effectiveness of peak reduction. Plotting CCDFs for the same signal set using alternative peak-reduction processing algorithms clearly describes their comparative effectiveness. For example, FIG. 7 depicts CCDFs corresponding to four peak-reduced WCDMA channels using various values for the magnitude threshold M. In FIG. 7 the right-most curve corresponds to the raw input and the other curves correspond to the peak-reduced channel signals.

As discussed above with respect to prior art attempts to solve the problems associated with peak-power reduction, in the absence of regulatory spectral constraints, the optimal peak-reduction approach would be to simply determine the excursion and subtract that waveform from the original signal. This would yield the clipped signal. However, a spectral mask constraint does in fact exist, e.g., in the wireless telecommunications field, and therefore the original signal must be designed to satisfy the spectral mask. Thus, since the original signal in such a system is designed to satisfy the spectral mask constraint, only the excursion contributes unacceptable spectral energy. Sufficient filtering must therefore be applied to the excursion waveform (consisting of many isolated excursion events), to achieve compliance with the regulatory spectral masks. While this approach will not achieve complete cancellation of the deleterious excursion events, it comes as close as possible within the constraints of such a filtering technique while complying with the regulatory spectral constraints. The peak-reduction approach described and claimed herein builds on such a "filtered excursion" concept to provide a more complete solution to the problems associated with peak-reduction processing.

It is readily apparent that the signal magnitude probability density function as depicted in FIGS. 5 and 6 can be altered simply by replacing the original signal by the clipped signal, as defined above. Unfortunately, as also discussed above, clipping is an intrinsically nonlinear operation which introduces abrupt discontinuities in higher-order signal derivatives. Such discontinuities result in so-called spectral splatter, which generates spurious spectral energy outside the regulatory spectral mask. There is thus a need to simultaneously satisfy the spectral mask and re-shape the magnitude probability density function. Various aspects of the approach of the present peak-reduction concept achieve this and other objectives.

Figure 1:
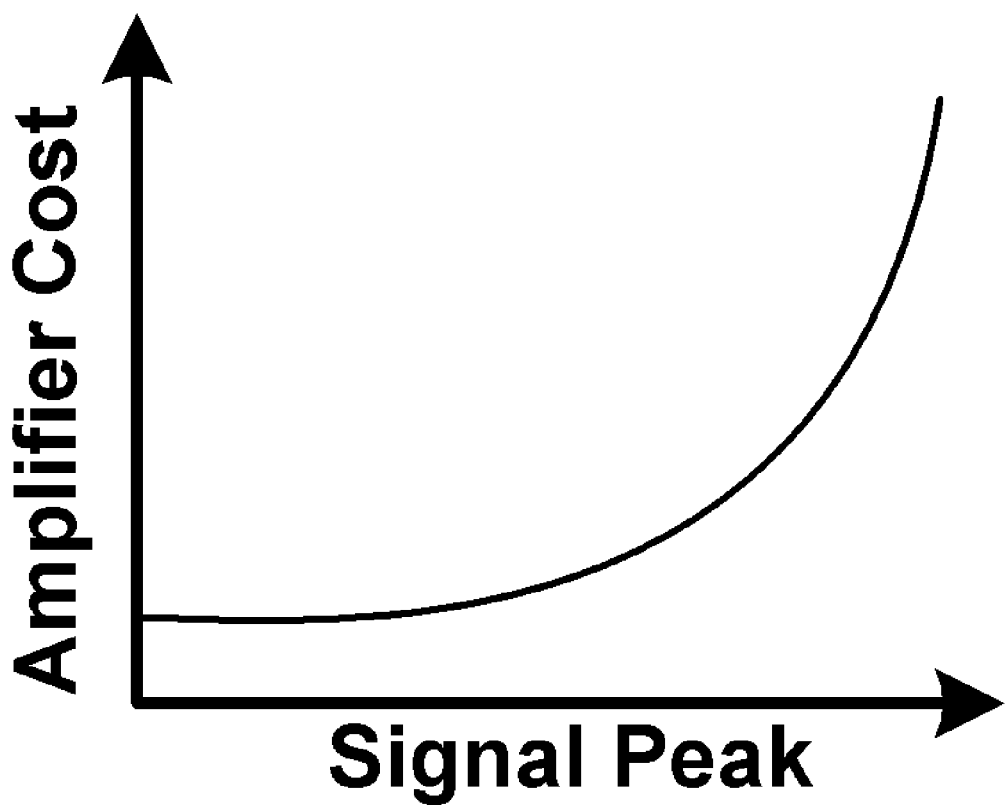
FIG. 1 illustrates the relationship between the magnitude of the signal peak and amplifier cost.
Figure 2:
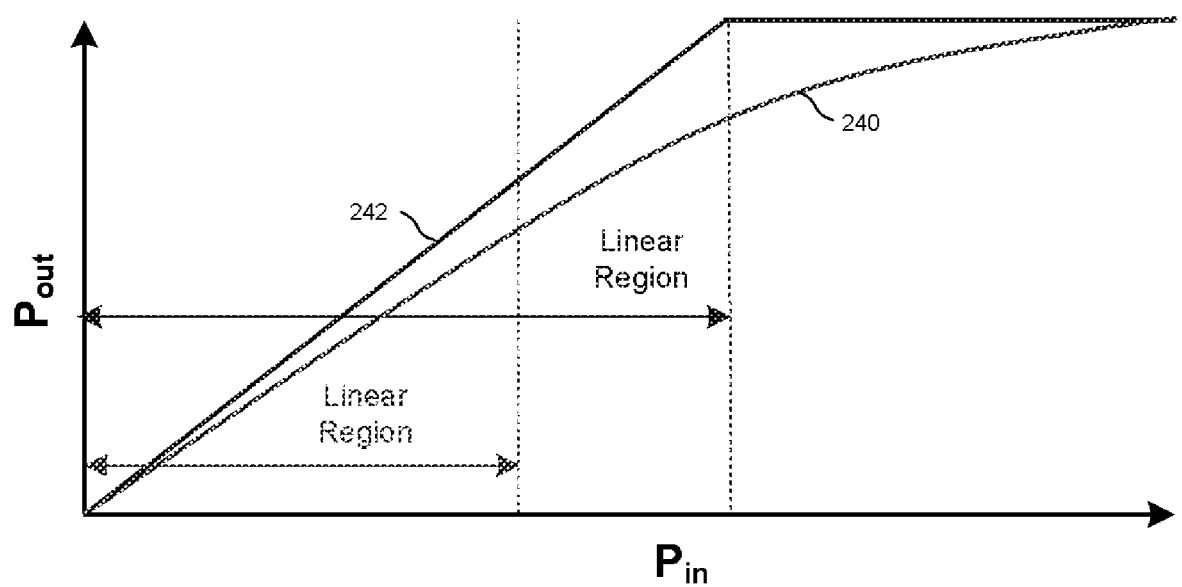
FIG. 2 is a comparison of nonlinear and linearized amplifier characteristics.
Figure 3:
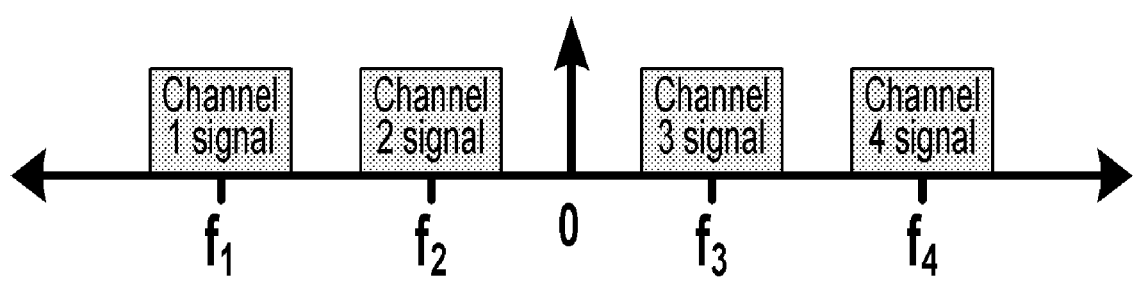
FIG. 3 shows the baseband complex spectra associated with adjacent cellular signals.
Figure 8:
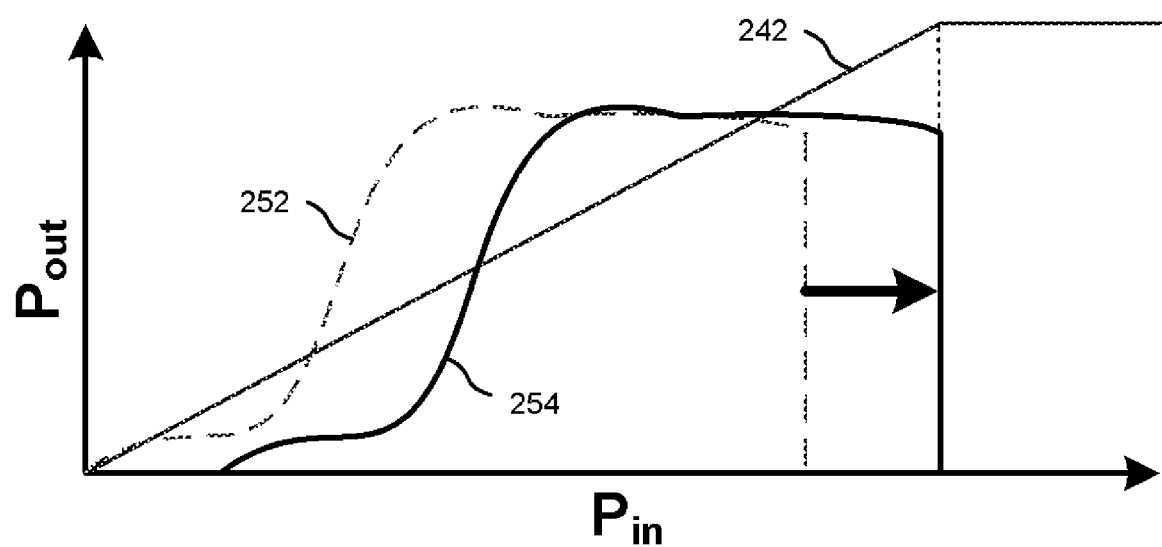
FIG. 8 shows an optimized relationship between peak-reduction and amplifier linearization.

With respect to the discussion of variation in signal magnitude above with respect to FIGS. 2, 5 and 6, note that peak reduction will permit the signal to enter the amplifier shifted further to the right whether or not linearization is used. If both peak reduction and linearization are used, the signal input power level may be increased (i.e. shifted to the right) so that the signal magnitude threshold is identical to the upper limit of the amplifier linear region. This yields the maximum average output power and operating efficiency possible with a particular signal and amplifier. A signal transmission system may employ both these processing techniques, offering unique synergistic benefits. FIG. 8 depicts a peak-reduced signal at two different input powers with respect to a linearized amplifier characteristic 242. In both cases, the amplifier operation is entirely linear, since the entire signal magnitude range lies within the amplifier's linear region of operation. However, the amplifier output power is greater when the input signal has been pre-amplified, which shifts the pdf curve 252 so that its magnitude peak aligns with the amplifier's maximum linear limit, as illustrated by the right-most magnitude pdf curve 254.

FIG. 8 graphically depicts the key relationships between peak reduction and amplifier linearization. An objective of the present invention is to minimize the signal's maximum PAR value, the vertical boundary ideally to be aligned with the maximum linear limit of the amplifier. For example, every 1 dB reduction in PAR increases the maximum average amplifier power output by an extra 1 dB. A 3 dB reduction in signal PAR can reduce the cost of a basestation amplifier by thousands of dollars, providing a significant economic incentive.

Figure 9:
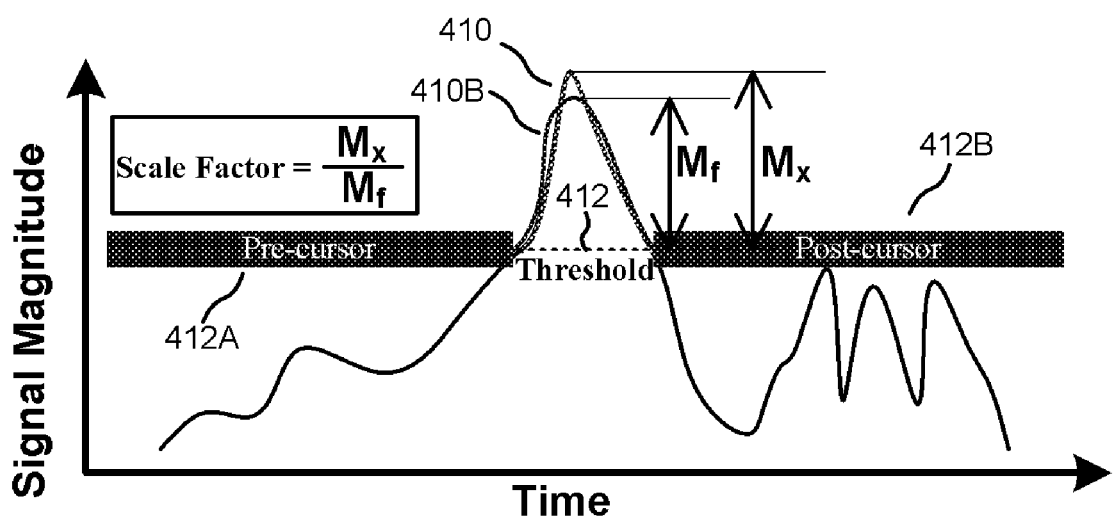
FIG. 9 shows exemplary raw excursion and filtered excursion waveforms including a portion of a signal exceeding a defined threshold.

FIG. 9 depicts a portion of a signal segment showing magnitude as it exceeds a defined threshold 412, the corresponding excursion event 410 and the filtered excursion 410B. The broad shaded bands represent pre-cursor 412A and post-cursor 412B segments, in which exponentially-decaying oscillations occur. Note that as the excursion filter system smooths the excursion waveform it alters the peak magnitude from what is required to completely cancel the peak when subsequently subtracted from the time-aligned original signal. Each filtered excursion must therefore be scaled to ensure that subsequent subtraction from the time-aligned original signal reduces the signal peak to match the defined threshold. It is thus apparent that the desired scale factor is the ratio of the excursion peak magnitude $M_x$ to the filtered excursion peak magnitude $M_f$. Since the filter's impact is invariant to scale changes, this scaling ensures that the filtered peak substantially matches the original excursion peak magnitude. However, the excursion scaling operation is complicated by the fact that the optimal scale factor is different for every excursion and depends on a complex interaction (convolution) between excursion samples and excursion filter system characteristics.

Figure 10:
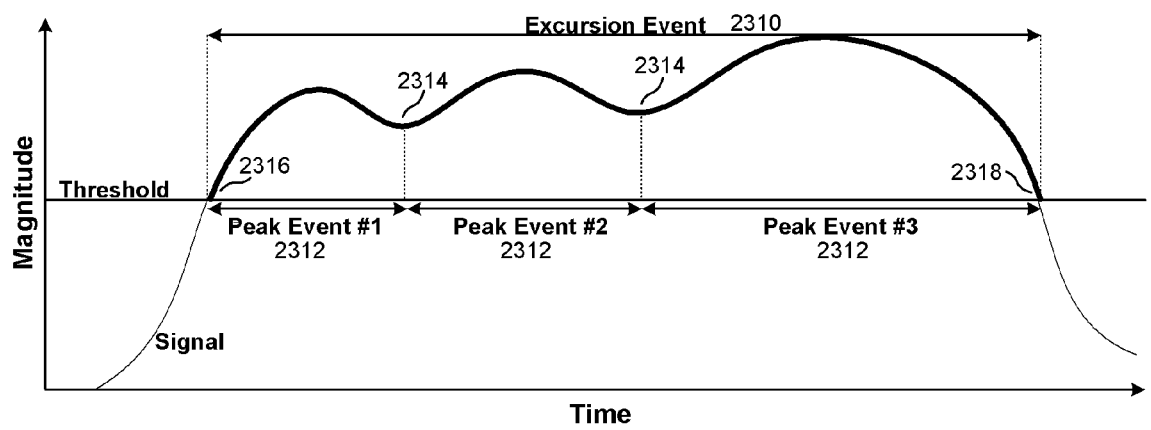
FIG. 10 is a diagram of an excursion comprising multiple peaks or "peak events"

Excursion events are typically comprised of multiple local peak events. The heuristic description above conveys the core concept of filtered excursions, and the need to scale each excursion by a factor depending on both the excursion shape and the applied filtering. However, prior to describing a functional architecture for peak reduction within the scope of the present invention, the definitions of terms must be extended to address the fact that excursion events, consisting of contiguous non-zero excursion waveform samples, often are comprised of multiple signal magnitude peaks. FIG. 10 depicts an example of such a multi-peak excursion event, and shows the manner in which each such excursion event 2310 may be partitioned ('parsed') into a set of contiguous peak events 2312. In this example, the boundary between peak events is defined as the magnitude sample at the local minimum; it may be arbitrarily included in either of the bordering peak events for purposes of scaling. The scaling procedure may then parse the excursion waveform into sets of peak events, determine the optimal scaling factor for the complex samples which comprise each peak event, and then apply the resultant scaling factor prior to filtering of the excursion signal to satisfy spectral mask constraints. Of course, in other embodiments of the present invention excursion events may be parsed differently, based on any characteristics or attribute of the signal excursion which results in the desired excursion reduction.

The present invention is described partly in terms of functional components and partly in terms of various processing steps. Such functional components may be realized by any number of components configured to perform the specified functions and achieve the various results. For example, the present invention may employ various elements, materials, signal sources, signal types, integrated components, amplifiers, filters, and the like, which may carry out a variety of functions. In addition, although the invention is described in the wireless communication environment, the present invention may be practiced in conjunction with any number of applications, environments, communication protocols, amplification systems, and signal processing systems, including, but not limited to, optical/acoustic applications, environments, communication protocols and systems. The systems described herein are merely exemplary applications for the invention. Further, the present invention may employ any number of techniques for manufacturing, assembling, testing, and the like.

Figure 11:
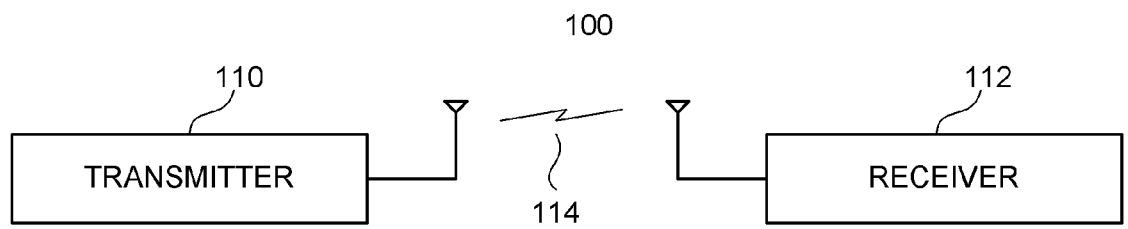
FIG. 11 is a block diagram of a communications system according to various aspects of the present invention.

Referring to FIG. 11, a communications system 100 according to various exemplary aspects of the present invention comprises a transmitter 110 and a receiver 112. The transmitter 110 provides signals such as optical signals, electrical signals, acoustic signals, or any other signal which may convey information within the scope of the present invention to the receiver 112 via a medium 114. The medium 114 may comprise any mechanism for transmitting information between the transmitter 110 and the receiver 112. In the present exemplary embodiment directed to a wireless communications system, the transmitter 110 provides electromagnetic signals to the receiver 112, such as radio frequency (RF) signals, wireless telephone signals, or wireless data signals. The medium 114 in the present embodiment is thus any medium capable of sustaining transmission of electromagnetic signals.

The transmitter 110 and the receiver 112 are respectively configured to transmit and receive signals transmitted via the medium 114. The transmitter 110 and/or the receiver 112 may be configured as a transceiver to allow the reception and transmission of multiple signals from the same unit. In the present embodiment, the transmitter 110 is configured to modulate and transmit multiple signals to multiple receivers 112. This configuration corresponds, to for example, a wireless communications basestation. In this embodiment, the receivers 112 comprise remote receivers, such as wireless telephones, computers, personal digital assistants, handheld electronic message devices or other such receivers. The communications system 100 may be configured, however, in any suitable manner for communicating between any transmitter 110 and receiver 112, such as computers in a network, for example via a wireless network using multi-carrier modulations such as orthogonal frequency division multiplexing (OFDM) or orthogonal frequency division multiple access (OFDMA).

The transmitter 110 of FIG. 11 may be suitably configured to process a digital signal and transmit a corresponding signal to the receiver 112. In a typical cellular communications embodiment, for example, the transmitter 110 may be configured in accordance with any appropriate specifications or standards for wireless digital communication, such as in accordance with Global System for Mobile Communications (GSM), time division multiple access (TDMA), and/or code division multiple access (CDMA) specifications or standards. In a data communications environment, the transmitter 110 may be configured in conjunction with any suitable data communications specification or standard, such as IEEE 802.11, 802.15, or 802.16. The transmitter 110 may be further configured in any suitable manner to receive digital information and transmit a corresponding analog signal to the receiver 112.

Figure 12:
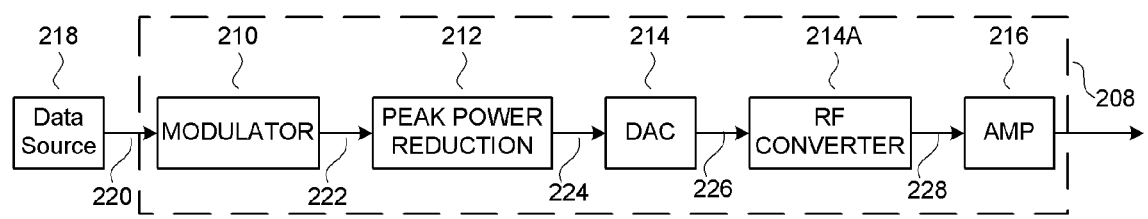
FIG. 12 is a block diagram of a signal processing system having a peak-power reduction component according to various aspects of the present invention.

For example, referring to FIG. 12, the transmitter 110 of the present embodiment includes a signal processing system 208 for processing a signal, such as for communication via the communication system 100. In the present embodiment, the signal processing system 208 includes a modulator 210, a peak-power reduction component 212, a digital-to-analog converter (DAC) 214, an RF converter 214A, and an amplifier 216. The modulator 210 receives digital information 220 from one or more data sources 218 and generates a baseband modulated signal 222.

In various embodiments, the peak-power reduction component 212 is configured to receive the modulated signal 222 from the modulator 210 and substantially reduce the peak power output requirement of the transmitter 110. The peak-power reduction component 212 may be additionally configured to inhibit spectral regrowth or other frequency components outside one or more desired bandwidths. In addition, the peak-power reduction component 212 may be further configured to inhibit or minimize the addition of noise to the signal to maintain an acceptable signal-to-noise ratio and/or remain within relevant error vector magnitude (EVM) constraints.

The DAC 214 is configured to receive a peak-reduced digital signal 224 from the peak-power reduction component 212 and convert the digital signal into an analog signal 226. The RF converter 214A translates the analog signal from a lower frequency (near or at baseband) to the desired RF transmission frequency prior to amplification. The amplifier 216 amplifies the analog RF signal 228 prior to transmission to the receiver 112. Additional distortion-compensation processing may be performed after the peak-power reduction component 212 and prior to the DAC 214.

Figure 13:
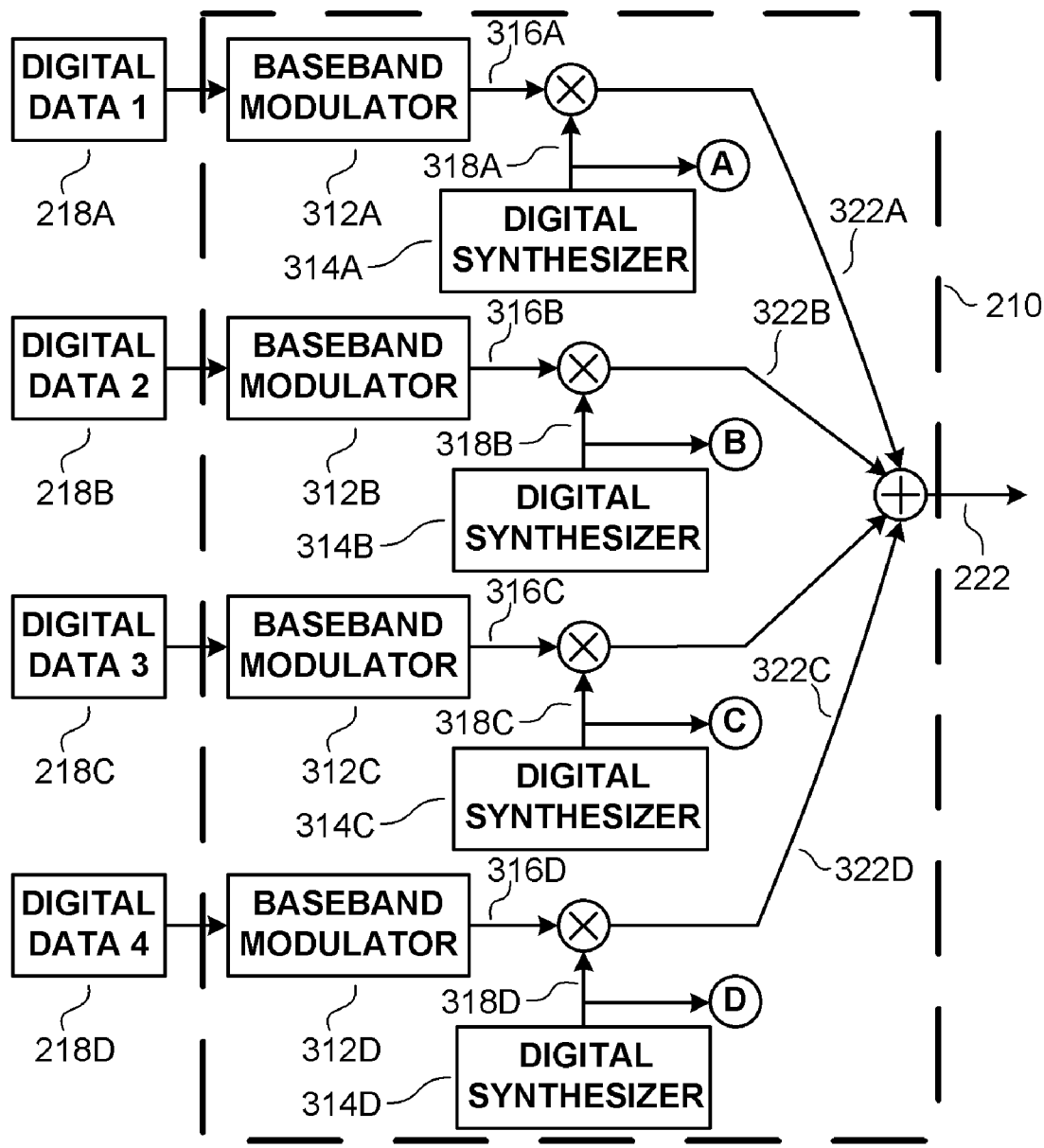
FIG. 13 is a block diagram of an MCS modulator.

The modulator 210 may comprise any suitable system for modulating a digital signal. Referring to FIG. 13, an exemplary modulator 210 comprises a conventional digital modulator and generates a baseband modulated multi-channel signal 222. The modulator 210 suitably comprises a multi-channel modulator for receiving multiple data streams, modulating the data stream for each channel and frequency translating the modulated signal to an appropriate offset frequency, and summing the various channel outputs into a composite output signal. The modulator 210 may be configured, however, in any suitable manner, for example as a single-channel modulator. The present exemplary modulator 210 comprises one or more baseband modulators 312 and one or more digital synthesizers 314. Each baseband modulator 312A-D converts data into a baseband waveform according to an appropriate modulation, such that each baseband modulator 312A-D converts information bits, such as compressed binary digital data corresponding to voice, data, or video signals, into a corresponding baseband digital waveform 316A-D. The baseband digital waveforms 316A-D may comprise any suitable waveforms, such as waveforms in accordance with a selected transmission encoding specification, such as GSM, spread spectrum, TDMA, CDMA, or the like. In an exemplary embodiment, the baseband digital waveforms 316A-D comprise time-varying sequences of complex pairs having an in-phase component (I) and a quadrature component (Q) occurring at a defined sample rate.

In various embodiments, each digital synthesizer 314A-D generates a complex digital local oscillator (LO) signal that multiplies the baseband digital waveform to generate offset-frequency modulated signals 322, which are then combined to form the baseband multi-channel signal 222. The digital synthesizer 314 may comprise any appropriate source of a digital carrier frequency or other signal to generate the individual offset-frequency modulated signals 322A-D. In the present exemplary embodiment, the digital synthesizer 314 comprises a conventional multiple-output digital synthesizer configured to provide several different LO signals 318A-D at different offset frequencies. These frequencies may, for example, correspond to offset frequencies for accepted transmission frequencies for a particular cellular or wireless network, or other communication spectral mask. In the present exemplary embodiment, the digital synthesizer 314 may suitably generate complex-exponential ("cisoid") signals 318A-D at the desired offset frequencies for the individual offset-modulated modulated signals 322A-D for each channel. In this embodiment of the present invention, the digital synthesizer output signal 318 is multiplied with the baseband digital waveform 316 for the relevant channel via a multiplier, thus translating each baseband waveform to the proper channel offset frequency, thus constituting the individual offset-frequency modulated signals 322A-D. The various offset-frequency modulated signals 322A-D may be summed to form the composite baseband modulated signal 222.

Referring again to FIGS. 11 and 12, in an exemplary embodiment of a peak-power reduction component within the scope of the present invention, the composite baseband modulated signal 222 is provided to the peak-power reduction component 212 from the MCS modulator 210. The peak-power reduction component 212 may be configured in any suitable manner to reduce the peak power output of the transmitter 110, such as by subtracting portions of the signal exceeding a threshold from the signal. The peak-power reduction component 212 may also inhibit transmission of unwanted spectral energy, for example frequency components outside a regulatory spectral mask. The peak-power reduction component 212 receives the baseband modulated signal 222 from the modulator 210 and processes the baseband modulated signal 222 according to any suitable process. For example, referring to FIG. 4, the peak-power reduction component 212 may be configured to generate an excursion signal in response to a peak portion 410 in the baseband modulated signal 222 having a magnitude beyond a defined magnitude threshold 412. The peak-power reduction component 212 suitably removes or reduces the peak portion 410 from the baseband modulated signal 222 in response to the excursion signal.

Figure 14:
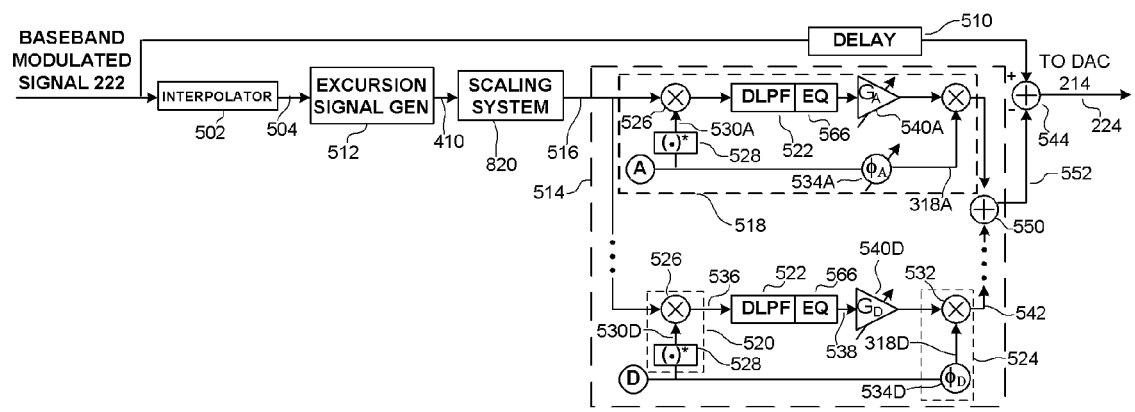
FIG. 14 is a block diagram of a peak-power reduction component.

Referring to FIG. 14, an exemplary embodiment of a peak-power reduction component 212 according to various aspects of the present invention comprises a delay element 510, an interpolator 502, an excursion signal generator 512, a scaling system 820, an excursion filter system 514, and an excursion reducer 544. The excursion signal generator 512 generates an excursion signal 410 in response to the baseband modulated signal 222 exceeding the magnitude threshold 412 as shown in FIG. 4. The output 410 of the excursion signal generator 512 may also be scaled by scaling system 820 prior to being processed by the excursion filter system 514. As shown in FIG. 14, the excursion filter system 514 filters unwanted frequencies from the signals produced by the excursion signal generator 512. An excursion reducer 544 subtracts the scaled and filtered excursion signal from the suitably delayed baseband modulated signal 222. The delay element 510 compensates for propagation time delay through the excursion signal generator 512 and the excursion filter system 514 so that the signal from the filter system 552 is time-aligned with the delayed baseband modulated signal 222.

Figure 15:
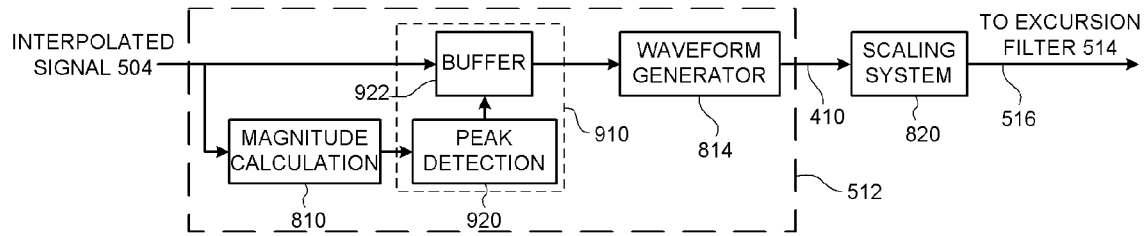
FIG. 15 is a block diagram of an alternative embodiment of an excursion signal generator.

The excursion signal generator 512 shown in the peak-power reduction component of FIG. 14 may be configured in any suitable manner to generate an excursion signal 410 responsive to peak portions of the baseband modulated signal 222 or other relevant signal. A suitably scaled and filtered version of the excursion signal 410 may then be subtracted from or otherwise used to reduce one or more peaks in the original signal. Moreover, the excursion signal 410 may be used in any suitable manner to reduce the peak power of the original signal. Referring to FIG. 15, an exemplary excursion signal generator 512 comprises a magnitude calculation circuit 810, a threshold circuit 812 (not shown), a peak parser 910 and a waveform generator 814. The output 410 of the excursion signal generator 512 is fed into the scaling system 820. The peak parser 910 identifies individual magnitude peaks in the signal 222, and the waveform generator 814 generates the excursion signal 410 in response to the identified peaks. In one embodiment, the excursion signal generator 512 receives the baseband modulated signal 222 and calculates magnitude values, such as successive magnitude values of the baseband modulated signal 222 based on the successive signal complex pairs. The excursion signal generator 512 compares the magnitude of samples of the signal 222 to the magnitude threshold 412. The excursion signal generator 512 generates the excursion signal 410 in response to the portions of the baseband modulated signal 222 that exceed the magnitude threshold 412. In yet another exemplary embodiment, the excursion signal generator 512 is configured to generate an excursion signal 410 that corresponds to the full duration (or full set of samples) of the baseband modulated signal 222 that exceeds the magnitude threshold 412, though the excursion signal generator 512 may be configured to generate an excursion signal 410 corresponding to any aspect of the signal exceeding the magnitude threshold 412.

Figure 16:
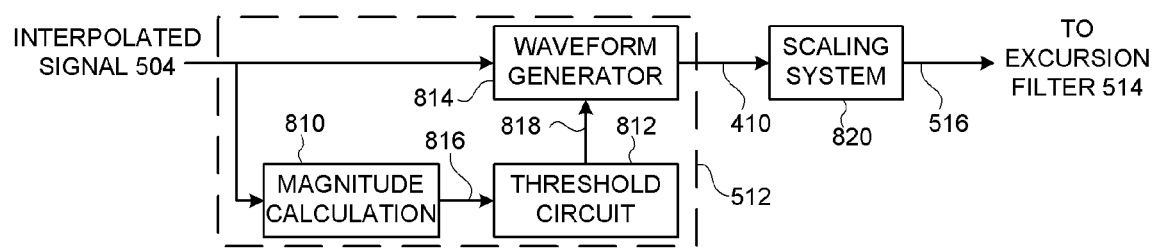
FIG. 16 is a block diagram of an embodiment of an excursion signal generator.

Referring to FIG. 16, an exemplary excursion signal generator 512 comprises a magnitude calculation circuit 810, a threshold circuit 812 and a waveform generator 814, whose output 410 is the input to common-mode (as opposed to channel-specific) scaling system 820. The magnitude calculation circuit 810 calculates the magnitude of the baseband modulated signal 222 and generates a corresponding magnitude signal 816. The magnitude calculation circuit 810 may be implemented in any suitable manner to determine the magnitude of samples of the baseband modulated signal 222, such as a conventional circuit configured to calculate the magnitude according to the following equation:

$$M(n)=[I^2(n)+Q^2(n)]^{1/2}$$

Where M(n) is the magnitude of the baseband modulated signal 222 for a complex sample pair at sample n, I(n) is the in-phase component of the signal for the complex sample pair I, and Q(n) is the quadrature component of the signal for the complex sample pair I. The magnitude calculation may be performed, however, according to any suitable technique or algorithm.

In the present embodiment as illustrated in FIG. 16, the magnitude signal 816 is provided to the threshold circuit 812, which compares the calculated magnitude to the magnitude threshold 412 and generates a corresponding comparison signal 818. The threshold circuit 812 may comprise any suitable system for comparing the magnitude of the baseband modulated signal 222 to the threshold. For example, the threshold circuit 812 may comprise a conventional comparator circuit or subtraction circuit.

The magnitude threshold 412 may comprise any suitable value and/or signal. For example, the threshold value may comprise a static value, such as one corresponding to the maximum power of the amplifier 216 or a power level slightly lower than the maximum power. Thus, the comparison signal 818 designates samples of the signal 222 corresponding to RF signal values that would exceed the maximum power level of the amplifier 216 or other suitable threshold. Alternatively, the magnitude threshold 412 may be a dynamic value. The magnitude threshold 412 may be adjusted according to any suitable criteria. For example, the magnitude threshold 412 may be calculated as a function of the signal power for the various channels and/or the amount of noise in the signal. Thus, if two channels are operating at maximum power and two other channels are operating at half the maximum power, the magnitude threshold 412 may be set at 75% of the maximum power. If the amount of noise in one or more channels approaches and/or exceeds a limit, such as the EVM threshold, the magnitude threshold 412 may be increased. Conversely, if the amount of noise is lower, the magnitude threshold 412 may be further decreased. Any suitable criteria or algorithm, however, may be used to select the magnitude threshold 412.

The communications system 100 may be configured to take advantage of the reduced peak-power requirements due to the peak-power reduction component 212. For example, the communications system may be designed or reconfigured to use a lower-power amplifier to transmit signals. In addition, the communications system 100 may be configured to use the additional power made available by the peak-power reduction component 212 to improve the link between the transmitter 110 and the receiver 112 and/or expand the coverage of the signal.

For example, the magnitude threshold 412 may be set at a selected level to reduce the overall peak-power demand of the transmitter 110. The average transmitted signal power may then be boosted so that the peak-power transmitted by the system returns to its original level, but with a higher average power of the transmitted signal. For example, if the threshold is originally set to reduce the peak-power requirement by 3 dB, the transmitted power of the peak-reduced signal may be increased by 3 dB to match the original peak-power. Thus, the same amplifier may be used to transmit a higher average power signal, thereby enhancing link quality. The magnitude threshold 412 may also be dynamically changed to reduce overall power consumption.

Reducing the level of the magnitude threshold 412 may raise the noise level in the transmitted signal. In many applications, however, the noise in the transmitted signal is relatively low compared to the ordinary noise level at the receiver, for example thermal noise. As a result, because the noise level has only slightly increased while the power of the transmitted signal has significantly increased, the signal-to-noise ratio (SNR) at the receiver tends to improve.

In various environments, the reduction of the magnitude threshold 412 to boost the transmission power may be unacceptable, for example by causing the SNR at the transmitter to contravene standards that may apply. For example, the current IEEE 802.16 standard requires the transmitter SNR to be no less than 19.6 dB. If the magnitude threshold 412 for the transmitter 110 is reduced beyond a point, the induced noise from generating the excursion may cause the SNR to drop below the 19.6 dB minimum, despite the improved overall quality of the link. In such environments, the improved link quality may be implemented as an option. For example, the transmitter 110 and receiver 112 may be configured to initially operate in accordance with the relevant standard. The transmitter 110 and receiver 112 may communicate to establish whether the other may operate using the improved quality link. If the units share the ability to communicate with the improved quality link, the transmitter 110 and receiver 112 may be reconfigured, either manually or automatically, to reduce the magnitude threshold 412 to the lower level and boost the respective transmission levels.

In one embodiment, the threshold circuit 812 monitors the EVM value for each channel and adjusts the magnitude threshold 412 to minimize signal peaks (i.e. maximize peak-reduction) while remaining within EVM specifications. If the noise is low enough that the measured EVM value is below the relevant limit, the threshold circuit 812 decreases the magnitude threshold 412. If the EVM magnitude approaches or exceeds the relevant limit, the threshold circuit increases the magnitude threshold 412.

Referring again to FIG. 16 and continuing with the description of the implementation details of the various exemplary embodiments, the comparison signal 818 is provided to the waveform generator 814. The waveform generator 814 generates the excursion signal 410 according to the comparison signal 818. The waveform generator 814 may be configured in any suitable manner to generate the excursion signal 410, such as a conventional subtraction circuit to subtract the magnitude threshold 412 value from the magnitude component of the baseband modulated signal 222. Another exemplary method for generating the excursion would employ the CORDIC algorithm. See, e.g., Ray Andraka, "A Survey of CORDIC Algorithms for FPGA-based Computers," Proceedings of the 1998 ACM/SIGDA Sixth International Symposium on Field Programmable Gate Arrays, Feb. 22-24, 1998, Monterey, Calif., pp. 191-200. Preferred CORDIC algorithm usage involves a series of phase-rotation operations to rotate the original signal vector (i.e. sample) to an equivalent-magnitude zero-phase vector, while simultaneously performing conjugate phase rotation operations on a vector initialized to zero-phase and magnitude equal to the magnitude threshold 412; the excursion sample equals the difference between this resultant vector and the original complex vector if the original signal magnitude is greater than the magnitude threshold 412, and equals zero otherwise. The operations of the threshold circuit 812 and the waveform generator 814 may be performed by a single circuit or system, such as a subtraction circuit configured to perform the comparison to the magnitude threshold 412 and generate the waveform by subtracting the magnitude threshold 412 from the magnitude of the baseband modulated signal 222. If the comparison signal 818 indicates that the magnitude signal 816 does not exceed the magnitude threshold 412, the waveform generator 814 may generate a null signal. If the comparison signal 818 indicates that the magnitude signal 816 exceeds the magnitude threshold 412, the waveform generator 814 generates a signal having a magnitude corresponding to the difference between the magnitude of the baseband modulated signal 222 and the magnitude threshold 412, and phase being identical to the baseband modulated signal. The resulting excursion signal may then be filtered, scaled, and subtracted from a suitably delayed version of the baseband modulated signal 222 to reduce signal peaks.

In various embodiments, a common-mode scaling system 820, as shown in FIG. 16, may be provided and configured to adjust the magnitude of the generated (excursion) waveform so that the resulting scaled excursion signal, after filtering, reduces peaks in the baseband modulated signal 222 that initially exceed the magnitude threshold so that they equal a selected value, generally the magnitude threshold value. The common-mode scaling system 820 receives the unscaled excursion signal 410 from the waveform generator 814 and selectively adjusts the magnitude of the excursion samples to generate the scaled excursion signal 516. The system 820 may scale the excursion signal 410 according to any suitable process and may be implemented in any suitable manner. For example, the system 820 may be configured to selectively adjust the unscaled excursion signal 410 such that the maximum magnitude of the peak-reduced signal 224 does not exceed the selected magnitude threshold. For example, if the magnitude threshold 412 for a particular system is 1.8 and the magnitude of the baseband modulated signal 222 is 4.0, the common mode scaling system 820 is suitably configured to scale the peak magnitude of the corresponding sample generated by the peak power reduction component 212, such as a scaled and filtered excursion signal 552 (as shown in FIG. 14), to 2.2. In still another example, the common mode scaling system may be configured to scale the excursion signal based on the ratio of the peak magnitude of the unfiltered excursion signal 410 to the peak magnitude of the filtered excursion signal 410B. As discussed above, this ensures that the scaled and filtered excursion peak magnitude substantially matches the original excursion peak magnitude. As can be appreciated, any implementation which achieves the desired objective of adjusting the magnitude of the generated waveform so that the filtered excursion signal reduces the signal peak to a defined threshold level or below is within the scope of the present invention.

With reference to FIG. 10, an excursion event 2310 may include multiple peak events 2312. The boundaries between the peak events 2312 may be defined according to any suitable criteria. Peak events 2312 are separated by a trough sample 2314, which may be defined as an excursion event sample having higher magnitude samples on each side. A peak event 2312 may be defined as a set of excursion samples for which the magnitude of immediately adjacent samples are either lower than the magnitude threshold 412 (at an excursion boundary) or higher than the magnitude of the trough between two peak-events). The common-mode scaling system 820 may thus suitably apply a selected scaling value to every sample of a particular peak event 2312, for example according to the magnitude of the highest magnitude sample in the pre-filtered peak event, the post-filtered peak event, or both. Thus, all of the samples between two troughs 2314 (or between the beginning of the excursion 2316 and the first trough 2314 or between the last trough 2314 and the end of the excursion 2318) are scaled using the same scaling factor, which is suitably selected according to the highest magnitude samples in the group of samples constituting the peak events 2312 of an excursion event 2310.

Thus, in various embodiments, as illustrated, for example, by FIG. 15, peak parser 910 may be provided and configured in any suitable manner to identify peaks in the incoming signal, such as via the magnitude signal from the magnitude calculation circuit 810. In one embodiment, the peak parser 910 comprises a peak detector 920 and a buffer 922. The peak detector 920 identifies a peak in the incoming signal in any suitable manner, such as by comparing the magnitudes of successive complex pairs in the incoming signal.

In the present embodiment, the peak detector 920 provides a signal to the buffer 922 when a peak is detected in the incoming signal samples. The buffer 922 is suitably configured to temporarily store the incoming signal while the peak detector 920 identifies the peaks in the incoming signal. The buffer 922 may comprise any suitable storage element, such as a FIFO buffer having an appropriate number of storage elements. When a peak is detected, the buffer 922 suitably provides the relevant data to the waveform generator 912. In the present embodiment, the waveform generator 814 is configured to generate an unscaled waveform in response to the detected peak in the incoming signal samples.

Figure 17:
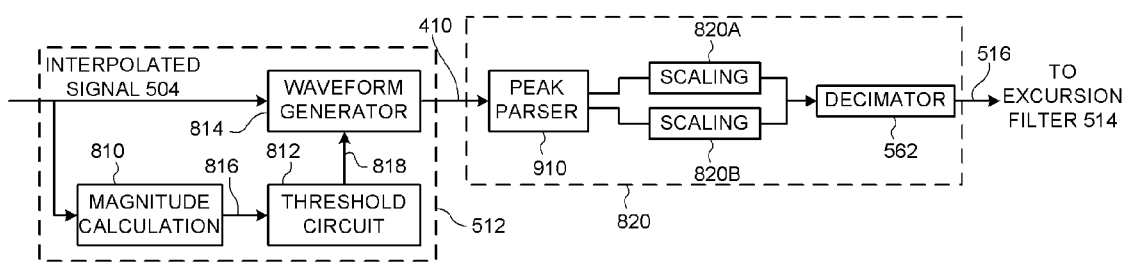
FIG. 17 is a block diagram of an excursion signal generator having multiple scaling circuits.

As shown in FIG. 17, the peak parser 910 may also be suitably configured to route the individual peaks to different scaling systems for processing. For example, when a first peak is identified, the peak parser 910 suitably transmits the peak event samples to a first scaling system 820A, and the next peak event samples may be transmitted to a second scaling system 820B, and the following peak event samples back to the first scaling system 820A or an additional scaling system. After scaling, the scaled samples may be recombined to form a single scaled excursion signal 516. Using different scaling systems 820A-B to process consecutive peaks may advantageously reduce inter-peak processing interference which may result from use of a single scaling system 820. Multiple scaling systems 820 may be implemented depending on processing system performance objectives.

In various embodiments, as shown illustratively in FIG. 14, the scaled excursion signal 516 is provided to the excursion filter system 514 to eliminate unacceptable spectral energy, such as frequency components induced by the excursion signal generator 512. The frequencies to be filtered may be selected according to any suitable criteria. Even though the excursion signal resembles unchannelized broadband noise spanning approximately 3× the bandwidth of the linear channelized signal, we may conceptualize it as consisting of two distinct components: spectral energy that cannot appear at the peak-reduction node 544 without violating EVM specifications; and all other excursion spectral energy; the role of the excursion filter system is to separate these components, passing the latter while eliminating the former. The excursion signal thus "contains" the channelized excursion energy (allowable spectral energy) as one component, and it is this component which is allowed to pass (with suitable scaling) by the excursion filter system. That is, the excursion signal can be considered as being comprised of two distinct components: (1) the allowable spectral energy; and (2) the unallowable spectral energy. However, there is no physical distinction between the allowable and unallowable spectral energy components until the excursions filter system applies channel filtering, i.e., the excursion is not channelized until filtering is applied. In the present embodiment, spectral energy is attenuated or eliminated at any frequencies other than those approved by the applicable regulatory spectral mask. In systems having multiple spectral energy levels across a particular signal passband, the excursion filter system 514 may be configured to adjust the relative spectral energy levels across the passband to approximately match the in-band variations. For example, if one portion of a channel's average power spectrum is 10 dB lower than the rest of the power spectrum, as might be the case when the channel consists of adjacent sub-channels, the excursion filter system 514 may introduce a matching 10 dB relative attenuation of the excursion spectrum across the same frequency range.

The excursion filter system 514 may be configured in any suitable manner to substantially filter the unwanted frequencies and transmit the desired frequencies, or otherwise promote the transmission of desired frequencies and/or attenuate unwanted frequencies. For example, the excursion filter system 514 is suitably configured to separate the scaled excursion signal 516 into individual frequency components corresponding to the input channels. The excursion filter system 514 filters individual components of the excursion signal corresponding to baseband modulated signal 222 to eliminate any unacceptable power spectral energy. Alternatively, the excursion filter system 514 may be configured as a bandpass or bandstop filter to pass or attenuate power spectral energy at selected frequencies, or otherwise configured to alter the distribution of power spectral energy over a defined frequency range. In addition, the excursion filter system 514 may comprise multiple filter systems, such as a cascade of filters or a set of parallel filters.

Figure 18A:
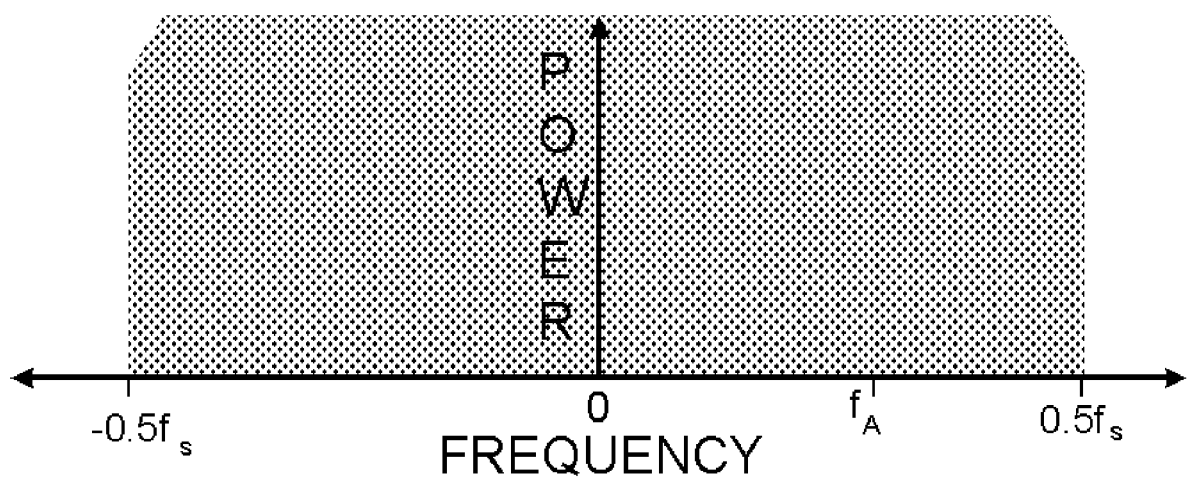
Figure 18B:
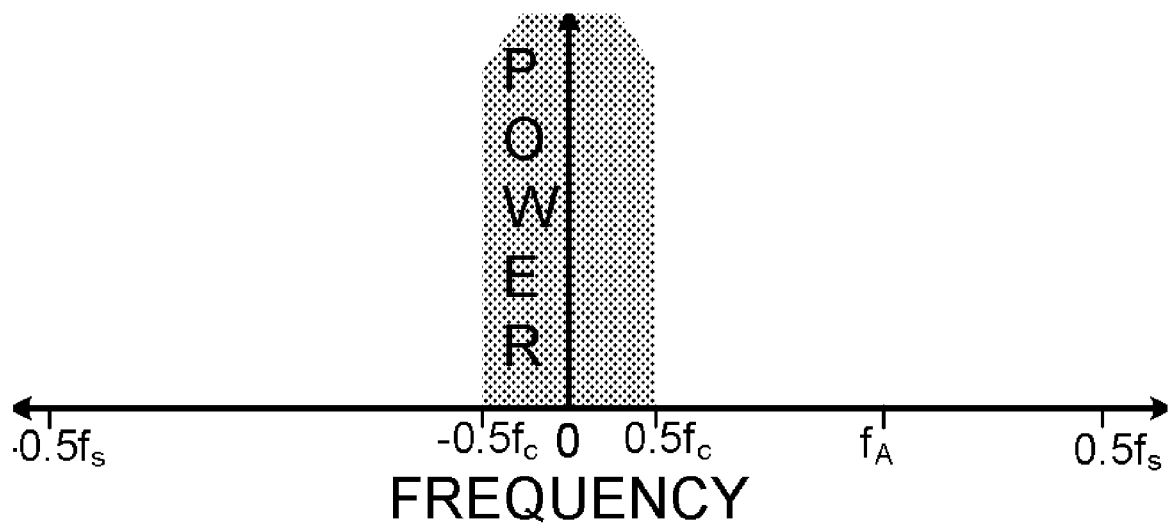
Figure 18C:
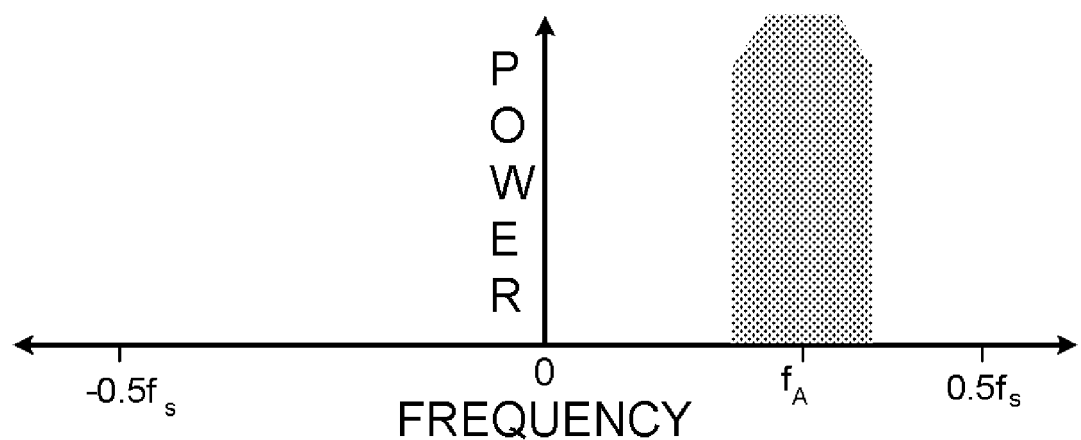

In the present exemplary embodiment, the excursion filter system 514 comprises multiple parallel channel filters 518 whose outputs are summed together. Each channel filter 518 suitably comprises a conventional digital filter for reducing excursion signal power at selected frequencies corresponding to the particular channel. For example, each channel filter 518 may include a down-converter 520, a low pass filter 522, a channel-specific gain-adjustment 540, and an up-converter 524, and each channel filter 518 suitably operates in a similar manner. Referring to FIGS. 14 and 18A-C, the down-converter 520 receives the scaled excursion signal 516, which exhibits a wide range of frequencies $f_s$ (FIG. 18A). The down-converter 520 shifts the frequency of the entire input spectrum to the left or right, such as by an amount substantially corresponding to the center/offset frequency $f_A$ of the relevant channel. The low pass filter 522 filters input signals to substantially eliminate signal energy above a selected cutoff frequency $f_c$ and substantially transmit signals below the selected cutoff frequency (FIG. 18B). The up-converter 524 shifts the frequency of the filtered signal to a higher frequency, such as to a selected frequency or by a selected amount. In the present embodiment, the up-converter 524 shifts the center frequency by an amount substantially corresponding to the center frequency of the relevant channel, i.e. back to the original center/offset frequency (FIG. 18C). Outputs 542 from the various channel filters 518 are then combined into a composite signal 552 by a filtered signal summer 550.

As shown schematically in FIG. 14, an exemplary down-converter 520 for the present embodiment comprises a multiplier 526 and a complex conjugate generator 528. The complex conjugate generator 528 receives the relevant digital synthesizer signal 318 from the relevant digital synthesizer 314 and generates a complex conjugate signal 530 corresponding to the complex conjugate of the digital synthesizer signal 318. The multiplier 526 multiplies the complex conjugate signal 530 with the scaled excursion signal 516. The resulting frequency-shifted signal 536 is a substantially identical waveform as the scaled excursion signal 516, but frequency-shifted by an amount substantially equal to the negative of the channel's offset frequency.

In the present embodiment, the frequency-translated signal 536 is provided to the low-pass filter 522. The low-pass filter 522 may be implemented in any suitable manner and may be configured to use any suitable cutoff frequency. For example, the low-pass filter may comprise a single filter, multiple parallel filters, or a cascade of filters. In the present embodiment, the low-pass filter 522 comprises a digital low-pass filter, such as a finite impulse response filter, having a cutoff frequency corresponding to one-half the approved bandwidth of the relevant channel. For example, if the approved channel frequency range is 20 MHz to 20.5 MHz, the cutoff frequency may be set at one-half of the 500 kHz bandwidth, or at 250 kHz. The digital low pass filter 522 thus transmits a filtered signal 538 comprising the components of the down-adjusted signal 536 that are below the cutoff frequency and attenuates spectral components above the cutoff frequency. The low pass filter 522 suitably comprises an approximately linear phase filter to minimize the amount of phase and/or magnitude error induced by the filter.

In a communications system using subchannels within the various channel passbands, such as an OFDMA environment, each channel filter 518 may include one or more bandpass or bandstop filters for filtering unwanted frequencies. For example, referring to FIG. 19, the various channels of baseband modulated signal 222 may include sub-channels at different frequencies within the channel, such as in an OFDMA system. Each such channel filter 518 suitably includes multiple bandpass filters or series of bandstop filters 1710 for each sub-channel configured to filter frequencies other than the sub-channel frequency. This sub-channel filtering may be preferentially implemented using the fast fourier transform (FFT), In addition, the gain of each sub-channel filter 1710 may be adjustable to control the magnitude of the particular sub-channel, for example to facilitate adjustment of the relative sub-channel spectral energy levels across the passband to approximately match the in-band variations, or to comply with sub-channel EVM constraints. For example, referring to FIG. 20, the baseband modulated signal 222 may comprise multiple main channels 1810, each of which includes multiple sub-channels 1812. Each sub-channel filter 1710 suitably operates as a magnitude adjustment circuit to adjust the gain for the sub-channel to reduce interference between sub-channels, such as by adjusting the sub-channel filter 1710 magnitudes according to the relative average signal power magnitudes of the corresponding sub-channel. Thus, the sub-channel filter 1710 may provide greater attenuation of the sub-channel excursion signal for a lower magnitude sub-channel signal, which tends to reduce the interference attributable to the higher energy levels in the adjacent sub-channels, and may be critical to comply with sub-channel EVM constraints.

In the present exemplary embodiment involving frequency shifting shown in FIG. 14, the filtered channel signal 538 is transmitted to the up-converter 524 for conversion back to the original channel frequency offset. In the present embodiment, the frequency-converter 524 comprises a multiplier 532 which multiplies the filtered signal 538 with the digital synthesizer signal 318 from the digital synthesizer 314 to return the filtered signal 538 to the original channel frequency offset, and a phase-shifter 534 required to compensate for processing-induced delay.

The signal processing system may also be configured to adjust the magnitude and/or phase of the filtered signal 538. Because the filtered excursion is to be subtracted from the baseband modulated signal 222, the filtered excursion is suitably configured to exactly match the portion of the baseband modulated signal 222 that exceeds the threshold 412. Channel filtering may alter its passband magnitude and phase relative to the baseband modulated signal 222. Infinite-impulse response (IIR) filtering may be used to reduce the filter complexity relative to that required using finite-impulse-response (FIR) filtering; however, IIR filtering introduces nonlinear phase distortion and passband magnitude ripple in the signal passband that can degrade peak-reduction, Further, the magnitude of the filtered signal 538 may be adjusted to conform to transmission requirements or other considerations. Consequently, the signal processing system may be configured using an equalizer to adjust the passband magnitude and/or phase of the filtered signal 538 to reduce passband distortion in the channel filter. The equalization function is suitably integrated into the low pass filter system 522, or may comprise a separate equalization circuit 566 for processing the filtered signal 538. The low pass filter 522 suitably comprises an FIR or equalized-IIR low pass filter. Low pass filter 522 is a single channel's LPF, whereas the impulse response of interest in computing common-mode scaling is that of the entire excursion filter system 514.

Phase equalization causes the composite phase shift as a function of the frequency for the cascade of the channel filter and the equalizer to be as close to linear as possible. The phase equalization function is suitably implemented as an all-pass filter (i.e. all magnitudes are passed with unity magnitude) whose phase-shift-vs-frequency characteristic can be adjusted. The phase equalizer is suitably configured to compensate for phase shifts induced by the low pass filter 522 and/or any other sources of unwanted phase shifts. Magnitude equalization addresses passband magnitude ripple distortion by adding a cancellative passband magnitude ripple, such that the net ripple (i.e. product of the cascaded magnitude effects) is reduced.

In the present exemplary embodiment as shown schematically in FIG. 14, each individual channel filter 518 also includes a dedicated phase correction element 534 to compensate for the phase shift introduced by frequency conversion operations and processing propagation delay. The phase correction element 534 suitably adjusts the phase (in radians) of the filtered signal 538 according to the radian frequency (in rad/sec) of the digital synthesizer signal 318 from the digital synthesizer 314 multiplied by the duration (in seconds) of the propagation delay through the channel filter 518. For example, the phase correction element 534 may adjust the phase of the digital synthesizer signal 318 prior to using it to up-convert the filtered excursion energy. This channel-specific phase shift assures that a channel filter 518 input sinewave in the channel passband will exit from that channel filter with no change in magnitude or phase.

In an exemplary embodiment including frequency shifting, the resulting frequency-converted, phase-adjusted scaled and filtered excursion 552 comprises a waveform corresponding to the scaled excursion of the baseband modulated signal 222 beyond the threshold magnitude. Due to the filtering, the phase-adjusted filtered signal 552 only an acceptable amount of spectral energy outside the approved bandwidth.

One purpose of the present inventive concept is that the scaled excursion signal 516 is provided to the excursion filter system 514 to remove any components in the scaled excursion signal 516 outside of the approved channel bandwidths. In particular, the scaled excursion signal 516 is provided to each down-converter 520, which translates the center frequency of the signal from each channel offset frequency to baseband. The frequency-translated signal 536 is then provided to the low-pass filter 522, which filters out frequencies above the cutoff frequency. In the present embodiment, the cutoff frequency corresponds to one half the bandwidth of the approved bandwidth. The filtered signal 538 is then adjusted by the up-converter 524 to frequency-translate the signal to the original channel offset frequency. The filtered signal, including sub-channels within a particular passband or channel, may also be processed for phase and magnitude adjustment to compensate for changes induced by the excursion signal generator 512 and the excursion filter system 514.

In a system using sub-channels, each channel filter 518 may adjust the magnitude of the various sub-channel filters according to the magnitudes of the sub-channels in the signal. Consequently, sub-channel signals in the excursion signal having lower magnitudes are subjected to greater attenuation than those having greater magnitudes. In a time division environment, each channel filter 518 may adjust the magnitude of the various channel filter gain-adjustments in a manner dependent on the time slots for the excursion signal according to the magnitudes of the signals in those time-slots in the baseband modulated signal 222. Thus, excursion channel time slots corresponding to signal channel time slots having lower energy magnitudes are subjected to greater attenuation than excursion channel time slots corresponding to signal channel time slots having greater energy magnitudes. Each channel filter 518 may also apply a smoothing window to the filtered excursion signal generated by that channel filter.

The composite filtered signal 552 comprises a waveform corresponding to the waveform of the excursion beyond the threshold in the baseband modulated signal 222. By filtering the excursion signal, unwanted frequency components, such as those attributable to spectral regrowth or other signal processing effects, may be eliminated from the composite filtered excursion signal 552. When this composite filtered signal 552 is subtracted from the delayed baseband modulated signal 222 by the excursion reducer, the resulting peak-reduced signal 224 tends to exhibit maximum peak magnitudes that are essentially equal to the magnitude threshold and exhibit few or no unwanted frequency components introduced by the peak-power reduction component 212. Consequently, the peak-power of the signal decreases, facilitating use of a lower cost amplifier 216 while satisfying all regulatory spectral constraints (masks) and minimizing distortion to the original signal.

In addition, the peak-reduction component 212 need not precisely determine the instant at which an excursion peak occurs, or the precise amplitude and phase value of the peak, as is critical in many alternative approaches. E.g., T. May and H. Rohling, "Reducing the Peak-To-Average Power Ratio in OFDM Radio Transmission Systems," Proc. 1998 Vehicular Tech. Conf., vol. 3, pp. 2474-78, May 18-21, 1998. Peak-reduction techniques that subtract a scaled and time-aligned version of a constant band-limited pulse shape from the original signal are known to exhibit high sensitivity to errors in determining the precise magnitude, phase and precise instant at which the peak occurs, forcing high over-sampling to mitigate this degradation, as described by M. Lampe and H. Rohling, "Reducing Out-of-Band Emissions Due to Nonlinearities in OFDM Systems," 49th IEEE Conference on Vehicular Technology, 16-20 May, 1999, pp. 2255-2259. The alternative method described herein completely eliminates this critical sensitivity by processing a multi-sample portion (i.e. peak-event) of the excursion waveform; each individual peak event is scaled, filtered and subtracted from the baseband modulated signal 222 with corrections for delays and equalization. Further, the peak-power reduction component suitably operates in the same manner, regardless of the number of input signals. The substantial peak-reduction performance improvement using the new approach is directly attributable to eliminating the prior art's limitation of scaling a constant (band-limited) pulse shape; the highly variable shape of signal peaks demands generation of an optimal cancellation waveform (i.e. filtered and scaled peak-event) for each individual signal peak.

The composite filtered signal 552 may be provided to the excursion reducer 544 or subjected to further processing. Additional processing may comprise any suitable processing, such as to improve the signal or adapt the signal to a particular environment. For example, the composite filtered signal 552 may be processed using further peak-power reduction processing or filtering, such as via another peak-power reduction component 212. The signal may exhibit slight variation in the maximum magnitude of its peaks due to filter response in the preceding peak-power reduction processing, scaling misadjustments, or other sources. Repetitive peak-power reduction processing reduces such variation.

Referring to FIG. 14, the filtered signal 538 may also be further processed according to any desired criteria. For example, the filtered signal 538 may be provided to a channel scaling/gain control element 540, for example between the channel lowpass filter (LPF) filter 522 and the up-converter

524. Such a channel scaling circuit may be used in the excursion-reduction approach of the present invention as illustrated, for example, by FIG. 21.

In one embodiment, the channel gain control element 540 may adjust the relative signal energy for the multiple signals to control the amount of in-band noise added to either the overall signal or any individual channel. For example, the channel gain control element 540 may be responsive to basestation control signals that adjust the transmission power for a particular channel, such as according to the estimated attenuation between the transmitter 110 and the receiver 112.

In an alternative embodiment, the channel gain control element 540 may adjust the magnitude of the filtered signal 538 to control the amount of noise added to the signal that may be caused by the peak-power reduction component 212. For example, in cellular communications, the acceptable amount of noise that may be added to a particular channel is typically constrained by error vector magnitude (EVM) specifications. The peak-power reduction component 212, however, may add noise to one or more channels. For example, peak reduction may add noise to a lower power channel. To reduce the added noise, the channel gain control element 540 may adjust the amount of peak-power reduction applied to the lower power channel by adjusting the gain applied to the filtered signal 538 for that channel.

FIG. 22 depicts a preferred embodiment of a functional architecture of a peak-reduction processing algorithm within the scope of the present invention and which may be further implemented according to the various configurations described above. The composite multi-channel (MCS) baseband modulated signal 222 splits into two paths: the bottom path computes the optimal peak-reduction cancellation waveform, whereas the top path simply delays the original signal so that the peak-reduction signal is properly time-aligned. The interpolator 502 is suitably interposed to expand the digital spectrum adequately so that the nonlinear spectral components created during excursion generation (an intrinsically nonlinear operation) remain adequately isolated from the original signal spectrum. For purposes of the present description, it is assumed that the sample rate of the MCS waveform is sufficient to satisfy the Nyquist-Shannon sampling theorem for the original baseband signal. In this case, since the bandwidth of the excursion signal will be at least three times that of the corresponding baseband signal, an interpolator 502 must increase the sampling rate by at least a factor of three. Interpolator 502 combines the functions of increasing the sampling rate of the signal, as well as filtering off any spectral 'images' created in this process. Occasionally, the sampling rate of the original signal might be increased to facilitate sample rate conversion, in which case the additional explicit interpolator 502 might be unnecessary. It is critical however, that the sample rate at the input to the excursion generator be at least three times that of the Nyquist-Shannon sampling rate required to represent the baseband MCS signal. The excursion signal, a complex baseband signal, is then split into two paths to facilitate scaling processing.

The output signal 504 of the interpolator is input to the excursion generator 512. The excursion signal 410 is generated by reference to a magnitude threshold level 412. The path from the excursion generator leads to the peak parser 910, which is part of the common-mode scaling system 820. The peak parser 910 parses the set of contiguous complex samples corresponding to each isolated excursion event into sets of complex peak event samples as illustrated in FIG. 10. As noted, the minimum-magnitude (i.e. 'trough') sample point, for example, may be arbitrarily assigned to either the preceding or trailing peak event. In a particular embodiment, the parsed peak events are used to compute an optimal (real) scaling factor that is applied to each sample within each peak event. The embodiment of FIG. 22 may include scaling filter 2512 and a peak scaling circuit 2514, as described more fully below with respect to FIG. 28. The scaled sample stream may then be low-pass filtered and decimated (any required low-pass filtering is usually implicit in a 'decimator') to reduce the sample rate back to the sample rate of the original MCS signal prior to applying the excursion filtering; a lower sample rate significantly reduces the power consumption and complexity of the excursion filter implementation. The decimator 562, whether explicitly shown or not, is preferentially the last operation in the scaling system. The scaled excursion signal 516 is processed by the excursion filter system 514. The excursion filter imposes spectral constraints on the scaled complex excursion sample stream. Constraints are also imposed on the excursion filtering process with respect to error vector magnitude levels, residual distortion noise and relative power levels of individual channel signals, as described in more detail below with respect to the exemplary embodiments of FIGS. 21 and 23. The scaled and filtered excursion signal 552 is then combined with a suitably delayed version of the baseband modulated signal 222 at excursion reducer 544 to produce the peak-reduced digital baseband signal 224.

Optimal peak reduction requires that each peak event be scaled by its own unique scale factor. The optimal scale factor equals the ratio of the peak-magnitude of the raw (unfiltered) excursion to the peak magnitude of the filtered excursion. It is clear from the discussion of the basic peak-reduction concept above that, if possible, simply subtracting the unfiltered excursion waveform from the delayed signal would result in a peak signal magnitude identically equal to the magnitude threshold 412 value. However, the excursion filtering required to satisfy spectral constraints distorts each peak event, with the result that the peak of the difference between the delayed signal and the filtered excursion will generally exceed the threshold. It is thus necessary to determine a scaling factor which will restore the condition that the final peak-reduced signal peak magnitude substantially matches the threshold value. If the filter reduces the peak excursion magnitude by a factor of two, then the excursion should be scaled by a factor of two to compensate for the filter's effective scaling. It is apparent that the optimal scale factor is the ratio of the peak of the raw excursion to that of the filtered excursion; it is less apparent how to easily obtain the value of the peak magnitude of the filtered excursion.

Ideally, each distinct peak event would be passed through its own excursion filter system, the proper scale factor determined, these scale factors then applied to each peak event in the composite excursion waveform and the scaled peak events then passed through a final excursion filter system. However, the very long length of the excursion filter system impulse response compared to the much shorter typical length of a peak event poses implementation challenges. First, implementing a large number of such excursion filter systems adds undesirable implementation complexity. Second, the addition of this long processing step would require a corresponding delay for the original MCS signal, and delay itself adds significant complexity. Resolution of this dilemma requires scrutiny of the impulse response of the excursion filter system.

The excursion filter system may, for example, include several (typically 1-4) parallel finite-impulse response (FIR) bandpass filters, which may be implemented using an architecture such as, for example, the one depicted in FIG. 24. This type of architecture facilitates dynamic tuning of the center frequencies for each of the N channels. Each channel filter may apply a unique spectral mask and each may be implemented using either finite-impulse-response (FIR) or infinite-impulse-response (IIR) filter architectures.

Regardless of the excursion filter system architecture employed, its impact is completely characterized by its impulse response, which will always appear as a very long (complex) sequence. The magnitude of the excursion filter system's impulse response will always exhibit an oscillatory variation in magnitude; it slowly increases, reaches a peak, and then slowly decays to zero. It is important to realize that the relatively few filter impulse response values located near the peak magnitude values will approximately determine the peak magnitude of the filtered peak event. Hence, the peak magnitude of the filtered excursion may be computed using a very simple (approximation) FIR filter whose impulse response main lobe approximates that of the full-complexity excursion filter system. FIG. 25 depicts the relationship between a long excursion system filter (upper) and the approximate filter (lower) used for scaling. The upper filter impulse response curve of FIG. 25 corresponds to the illustrated full-complexity multi-tap digital filter whereas the lower curve corresponds to the illustrated approximation filter having far fewer taps. The filter output at the instant when the peak event magnitude peak is centered in either the full excursion filter system or the simplified scaling filter is substantially identical, since the peak event length is substantially the same as the scaling (approximation) filter length. It has been found that scaling filters of very modest length yield nearly ideal peak event scaling. The magnitude of the filtered peak event is preferably computed when its peak magnitude point is aligned with the peak magnitude of the excursion impulse response. The optimal scale factor substantially equals the ratio of this magnitude value to that of the unfiltered peak event.

In the present exemplary embodiment, each parsed peak event is passed through a separate scaling filter, thereby determining the required scale factor with precision and low complexity. As discussed above, only a few such scaling filters are required to substantially approximately compute the optimal scale factor, i.e., the ratio of the peak of the raw excursion to the peak of the filtered excursion. The (real) scale factors are then used to apply optimal scaling to each sample in each peak event as it emerges from the delay shown, for example, in FIG. 22. It is important to realize that this scaling filter concept, although discussed herein in the context of MCS, applies also to peak-reduction of OFDM and OFDMA waveforms, such as WiMAX signals, where many different sub-channel modulation types and power levels characterize the transmission, and EVM constraints must be satisfied. OFDMA transmissions may dynamically vary the sub-channel power levels and modulation orders in response to environmental conditions, as do MCS channels, and at any point in time each channel has a unique maximum allowable value of noise power based on the channel's dynamically-varying signal power and modulation order (with attendant EVM value). The vector consisting of channel noise power maxima forms a passband energy mask which when transformed into the time domain with an inverse-FFT yields a characteristic filter impulse response analogous to both the full and simplified excursion filter in FIG. 25. Optimal scale factors for each peak event across the OFDM symbol are determined using a similar procedure as described for MCS waveforms. This processing is described in FIG. 32. Knowledge of the modulation type used in each sub-channel, and the EVM specification associated with that modulation type, permits calculation of a vector of allowed relative noise power levels for each channel. The absolute amount of peak-reduction noise in each channel is then uniquely determined by these relative weightings and the actual magnitude threshold value. FIG. 33 depicts the integrated OFDM peak-reduction system architecture, in which the magnitude threshold is adaptively varied so that every OFDM channel has the maximum allowable amount of noise added to it by the peak-reduction processing. This assures the maximum possible amount of peak-reduction consistent with the set of channel modulations and their associated EVM specifications. The scaled excursion waveform consisting of the concatenated scaled peak events is filtered by forming the dot-product of the scaled excursion waveform vector and the composite vector of passband and out-of-band weights described above. Finally, the dot-product vector is transformed into the time domain with an inverse-FFT, forming the filtered excursion waveform vector; this is then time-aligned with the delayed OFDM symbol vector and subtracted from it to yield the peak-reduced OFDM symbol.

The apparent simplicity of this unique scaling approach obscures an important assumption: that individual peak events may be scaled independently of proximate peak events, i.e., a particular peak event may be scaled without regard to scaling of, for example, a peak event which either precedes or trails the peak event under consideration. Research has determined that the described approach offers near-optimal peak-reduction performance; more sophisticated scaling techniques do not yield appreciably better results. The following conclusions may thus be drawn: (1) excursion filtering adequately smooths the many abrupt gain discontinuities thus precluding the induced amplitude-modulation from generating spectral mask violations and (2) the scaling error caused by proximate peak events is minimized because each target peak event is centered in the scaling filter main lobe, attenuating the relative impact of all proximate peak events.

Before expanding the description beyond the exemplary architecture of FIG. 22 it is important to understand how the error-vector magnitude (EVM) constraint interacts with the dynamically-varying relative power levels of the individual channel MCS signals. The EVM constraint and excursion filter gain are inextricably intertwined. The EVM specification ensures that standard link receivers are designed such that they will operate on transmitted waveforms which satisfy some defined minimum quality level. The channel EVM specification is defined as the maximum tolerable ratio of noise to signal in each channel. Specifically, the EVM specification reads as $$EVM_{rms}\% \equiv 100\sqrt{\frac{\langle P_N \rangle}{\langle P_S \rangle}}$$

Where $P_N$ is the channel noise power and $P_s$ is the channel signal power. The channel-specific EVM specification constrains the total (composite) noise level in each transmission channel. Composite noise consists of several components including: (1) noise generated by peak-reduction; (2) in-channel 'noise' corresponding to linear distortion induced by frequency translation and amplification and (3) in-channel 'noise' induced by the power amplifier. In addition to the fact that the channel signal powers are varying dynamically in response to estimated link propagation losses, EVM levels for each channel may also vary dynamically. Bandwidth-efficient (i.e. higher-order) modulations demand lower EVM levels for tolerable link degradation, and any link may switch between modulation types at any time. Since residual distortion contributed by the amplifier and frequency conversion is also time-varying, and amplifier nonlinear noise is signal-dependent, ensuring that the EVM constraint is satisfied poses a major basestation design challenge.

Excursion generation, an intrinsically nonlinear operation, generates nonlinear spectral energy that is approximately uniformly spread over the linear signal bandwidth; the level of nonlinear energy can be determined entirely by a few maximum-strength channel signals. This presents difficulties with respect to the propagation of any weak channel signals because the ratio of signal power to the relatively-fixed nonlinear noise level decreases as channel signal power decreases. At low channel signal power levels, the nonlinear noise in such a weak channel bandwidth may violate the EVM constraint. One response to this problem, varying the gain in each excursion filter channel to track the relative power in that channel has been previously described (See U.S. Patent Publication No. 2004/0266369). Simulations demonstrated such a simple gain control strategy prevented nonlinear noise from degrading weak-channel EVM. However, this simple gain control strategy reduces channel gains much more than necessary to satisfy EVM constraints, yielding sub-optimal peak-reduction performance; moreover, it is unable to adapt to variations in the other noise contributions cited above.

It is thus apparent that there is a difference between the degree of gain control required to meet EVM constraints and that required to achieve optimal peak-reduction scaling. Optimal peak-reduction scaling requires that peak-event-specific common-mode scaling be applied to each peak event sample whereas EVM protection requires channel-specific gain control (rather than common-mode gain-control) responsive to the average power over many peak events. However, benefits within the scope of the present invention may be achieved using both the described common-mode scaling and channel-specific scaling together or either alone. Moreover, the common-mode scaling of the present invention may be adaptively responsive to a measured channel signal quality even in the absence of channel-specific gain control. For example, the common-mode scaling system may adjust peak event samples based on a feedback signal comprised of a specified error vector magnitude value and/or a residual channel or composite noise level.

The conceptual basis for the channel-specific gain control strategy within the scope of the present invention is that the linear and nonlinear distortion noise induced by frequency conversion and amplification processing may be estimated and adaptively mitigated during subsequent processing, leaving some measurable amount of residual distortion noise. Since this noise is independent of the peak-reduction processing noise, the composite noise power will be the root-mean-square (rms) sum of each of the independent noise processes. Both these noise processes are only loosely correlated, and therefore combine approximately in an rms manner. Once the rest of the channel noise is estimated, knowledge of the channel EVM limit permits computation of the maximum noise that may be added by peak-reduction processing. It is then possible to measure the short-term average noise actually being added by peak-reduction, and use the ratio of these values to determine the proper gain for a particular channel. Recall that optimal peak-reduction requires each channel gain to be unity. Thus when the measured channel noise is less than required to satisfy the EVM specification, the gain should default to a value of unity. However, when the peak-reduction noise level exceeds its limit (as determined by the channel EVM limit and the estimated residual channel noise), a corrective gain equal to the ratio of the noise limit to the measured noise must be applied. If the measured peak-reduction rms channel noise is twice as high as permitted, a gain of 0.5 must be applied to ensure EVM compliance.

The exemplary functional architecture discussed above with respect to FIG. 22 may be replaced with the exemplary embodiment of the invention as depicted in FIG. 21, showing an exemplary excursion filter system 514 in detail. However, the architecture of FIG. 22 is an equally valid implementation of various aspects of the present invention. A single channel filter 518 is shown in detail. Each channel filter 518 is functionally identical, although their parameter values will generally be distinct.

The exemplary embodiment of FIG. 21 includes an excursion filter system 514 which further includes an adaptive channel scaling (gain control) circuit 548 which compares the channel noise to a gain control threshold based on a relevant EVM standard. The EVM values are suitably computed on a channel-by-channel basis. Under various standards, the maximum channel noise may be specified as having an EVM limit a, such as 17.5% or 12.5% of the root-mean-square (rms) power of the corresponding channel signal of the baseband modulated signal 222. Referring to FIG. 21, the average channel signal power may be computed, then scaled based on the EVM specification for that channel, to obtain a limit on the total channel noise power. A transmitter system may employ any suitable techniques and/or systems to reduce the noise induced by linear distortions, such as linear equalization, as well as to reduce the other distortion noise, such as noise induced by nonlinearity intrinsic to high-power amplifiers, for example by linearization processing. Distortion mitigation techniques, however, may not eliminate all such distortion noise energy. The channel gain control circuit 548 may be configured to measure an amount of residual distortion noise energy in each channel after application of distortion reduction processes, such as after equalization and linearization processing. The channel gain control circuit 548 may subtract this measured residual distortion noise energy from the EVM-permitted amount, which defines the permissible noise that may be added to each channel by the peak-reduction processing procedure. If the rms power of the noise does not exceed the permissible amount, the channel gain control circuit 548 may maintain unity gain resulting in the maximum peak reduction. If the rms power of the noise exceeds the threshold, then the channel gain control circuit 548 attenuates the filtered signal 538. The attenuation may be selected according to any suitable criteria. In the present exemplary embodiment, the attenuation is selected to promote compliance with the relevant channel EVM criterion. Thus, the desired gain $G_k$ may be calculated as:

$$G_k \equiv \begin{cases} 1\_\text{if}\_P_{xk} \leq AP_{xk} \\ \sqrt{\dfrac{AP_{xk}}{P_{xk}}}\_\text{otherwise} \end{cases} \quad AP_{xk} \equiv \alpha^2 P_{sk} - N_k$$

Where $P_{xk}$ is the power of the signal exceeding the magnitude threshold 412 for the kth channel, and $P_{sk}$ is the signal power in the kth channel, $\alpha$ (which may include some margin) is the EVM limit for the kth channel, and $N_k$ is the estimated residual distortion noise for the kth channel. The maximum allowed amount of channel noise added to the kth channel due to peak-reduction processing, $AP_{xk}$, is computed by subtracting the estimated residual (linear and nonlinear) distortion noise, $N_k$, associated with frequency conversion and amplification from this computed value of maximum acceptable (total) kth channel noise, $\alpha^2 P_{sk}$. This equation corresponds, as an example, to the desired-gain plot shown in FIG. 26.

$AMR_k$, the ratio of the allowed added peak noise to the measured peak noise in the kth channel is computed in the divider 2210. If this ratio is less than unity, there is no need to reduce the gain applied to the filtered channel excursion signal. However, if this power ratio exceeds unity, then the gain must be reduced by a factor equal to the square-root of $AMR_k$. This gain value, $G_k$, 2216 is computed and applied to a version of the filtered channel excursion signal at the output of the delay operator 2112. In addition, a modified version of this gain is fed back to the scaling system to ensure that peaks are scaled to reflect the new channel filter gain. The gain modification is required to avoid control loop stability problems encountered if feedback gain values drop below a defined minimum. This minimum gain value, MinG, is sufficiently low that negligible peak scaling error is introduced by limiting the lowest gain value fed back to the scaling system, as shown in FIG. 21.

The exemplary embodiment of FIG. 21 provides a method for ensuring that the long-term average value of EVM remains close to the value of $\alpha$, but because the short-term EVM exhibits some random variation about this value due to the structure of the signals—which vary dynamically, the limit may be occasionally exceeded. Thus, a fixed nominal $\alpha$ value must be selected such that the upper reaches of the dynamic variation seldom exceed the specified limit. This implies that some peak-reduction potential will remain unused if $\alpha$ is fixed. It is also difficult to empirically select an $\alpha$ target. The present invention thus includes an automatic adaptive system that adjusts each channel a so that the EVM substantially matches the allowed limit. In this and similar embodiments, for example, a criteria is specified regarding toleration of the EVM values exceeding a defined limit, for example by specifying the percentage of time such an excess EVM is acceptable. A determination is then made regarding the extent to which the defined limit is actually exceeded. The target value of $\alpha$ is reduced if the tolerable limit is exceeded. On the other hand, the target value of $\alpha$ is increased if the tolerable limit is not reached. The difficulty of empirically selecting a target value for $\alpha$ is thus eliminated and the maximum amount of peak reduction achieved under all circumstances.

Referring again to FIG. 21, in this embodiment the baseband modulated signal 222 is provided to the delay element 510 and the interpolator 502. A magnitude threshold 412 and an excursion generator 512, which may comprise magnitude calculation circuit 810, threshold circuit 812, and waveform generator 814, identifies portions of the interpolated baseband modulated signal 504 beyond the magnitude threshold 412 and generates a corresponding unscaled excursion signal 410. The unscaled excursion signal 410 comprises any suitable signal for reducing the peak in the baseband modulated signal 222.

The unscaled excursion signal 410 is processed by the scaling system 820 in such a manner that the maximum magnitude of signal peaks in the peak-reduced signal 224 is approximately equal to the defined magnitude threshold 412. The scaling system outputs the scaled excursion signal 516 for further processing by the excursion filter system 514.

In the illustrative embodiment shown in FIG. 21, the complex sample stream from the excursion generator is optimally scaled, and then filtered by the excursion filter system 514 consisting of multiple parallel channel filters 518. Bandpass filtering is accomplished using cascaded down-conversion, low-pass filtering, and then up-conversion; the indicated phase-shift is a common feature of this form of bandpass filter implementation. $P_{xk}$ is computed as the short-term average rms noise power added to a channel by peak-reduction processing. As discussed, the maximum permissible value of the short-term average rms noise power is computed from the average channel signal power, the EVM target value ($\alpha_k$) and the estimated residual (linear and nonlinear) distortion noise, $N_k$, associated with frequency conversion and amplification. Note that, as individual channel gains vary over time, common-mode gain values within the scaling unit 820 must be adjusted to maintain optimal peak event scaling.

FIGS. 27 and 27A illustrate the performance achievable using the peak-reduction functional architecture shown in FIG. 21 with a particularly challenging set of channel signal power levels: two adjacent strong channels and two adjacent weak channels. FIGS. 27 and 27A characterize simulated weak channel gain and EVM variation using the architecture described above. The top curve 2710 of FIG. 27 shows the raw EVM variation over time, the middle curve 2712 shows the corresponding gain-controlled EVM and the bottom curve 2714 is the channel gain multiplied by a factor of ten. Note that even though the weak channel's relative amplitude is only 0.1, the adaptive gain control approach described and claimed herein results in achievement of an average weak channel gain of approximately 0.6, and even during intervals of peak EVM the weak channel gain is greater than 0.5. These detailed computer simulation results verify that the present inventive approach and the described architecture ensures EVM compliance while minimizing signal peak excursions. FIG. 27A confirms that this has been achieved without violating the WCDMA spectral mask. In the absence of adaptive gain control, the raw EVM 2710 exhibits ±5% variation, which would require wasting 5% of the noise budget on margin. Note the greatly reduced (five-fold) EVM variability 2712 using the inventive gain control approach. The channel gain 2714 clearly shows the dynamics induced by the adaptive gain strategy described and claimed herein, and the tightly-controlled resulting channel EVM clearly illustrates the benefit of this gain-control strategy. FIG. 27A depicts the power spectral density of the channel signals, particularly the two weak channels, both before 2718 and after 2716 the adaptive gain control strategy has been applied; clearly there is negligible spectral degradation (as far down as 80 dB) associated with the described gain control strategy.

The gain control strategy described and claimed herein impacts the peak-reduction performance in the following manner. Only those weak channels which require EVM protection actually exhibit gain reductions, and then only the minimum required to satisfy EVM constraints; stronger channels maintain their near-unity gains in order to maximize achievable peak-reduction performance. Research demonstrates that the gain control approach of the present invention protects weak channels from EVM violations while achieving near-optimal peak reduction.

The cited prior art references authored by Armstrong failed to recognize the benefits of separately filtering the excursion and then subtracting the result from the delayed original signal for all conventional OFDM signals. The prior art recognized the need to interpolate the signal prior to clipping the OFDM signal, as well as the need to apply filtering to reduce the out-of-band OFDM signal energy sufficiently to comply with regulatory spectral masks. The prior art failed to realize the importance of applying in-band dynamically adaptive filtering to protect any relatively weak channel signals, and failed to recognize the opportunity to apply adaptive gain control to channels to ensure that they satisfy EVM specifications. The prior art also failed to grasp the benefit of adaptive peak scaling in order to greatly improve peak reduction performance. The techniques and systems described and claimed herein thus provide numerous advantages over prior art techniques and systems and are critical for ensuring EVM specifications are met for each of the sub-channels within the OFDM signal, particularly as they dynamically vary in transmit strength. Of course, these advantages apply to MCS as well.

The algorithm/architecture described above may also be configured to monitor the final peak reduced signal magnitude statistics, thereby adaptively adjusting the threshold value to optimize peak-reduction performance. The industry-standard definition of a signal 'peak' is that magnitude value which is exceeded 0.01% of the time. The architecture described above permits accurate measurement of signal statistics and concomitant adjustment of the threshold value to minimize this statistical metric of signal peak.

The peak-reduction algorithm described above with reference to FIG. 21 works very well in minimizing the PAR when all four channels are at maximum power, and therefore achieves the benefit of reducing the cost of the high-power amplifier (HPA) needed to support this embodiment of the invention. However, the life-cycle cost of a basestation is greatly impacted by the power consumption of those same HPAs. A further modification to the algorithm described with reference to FIG. 21 wherein the threshold value is adaptively varied yields additional benefits in power consumption over the lifetime of the transmitter. Consider the situation in which all four channels are transmitting at a power level that is only 10% of their required peak transmission power levels. This situation actually occurs far more frequently than that in which all four channels are at maximum power. If the magnitude threshold 412 is the same as that which minimizes PAR for all four channels at maximum power, the peak-reduction processing algorithm described with reference to FIG. 21 will not have the desired effect of reshaping the CCDF of the signal, since the signal will only very rarely exceed this high magnitude threshold 412 level. If the PAR is to be minimized even at this reduced power level, the threshold value must be adaptively reduced.

The present invention therefore includes in one embodiment, as illustrated in FIG. 23, an integrated control algorithm for both channel gains and magnitude threshold 412 driven by $AMR_k$, the ratio of allowed peak-reduction noise power to measured peak-reduction noise power in each channel; the square-root of the channel $AMR_k$ value is referred to as that channel's 'headroom,' since it equals that channel's estimated gain margin. Gain control loop stability considerations establish a minimum allowed value of channel gain, MinG. If driven at defined time intervals, this algorithm is executed as follows:

Magnitude Threshold Control:
If any $AMR_k$<MinG, increase M
Else, If any $AMR_k$>1.0, decrease M
Else, maintain M at current value This addition to the peak-reduction architecture and algorithm described with respect to FIG. 21 results in the peak-reduction architecture and algorithm depicted in FIG. 23. FIG. 23 is identical to FIG. 21 with the addition of feedback from the excursion filter system 514 to the threshold control system 2208, as shown by the dashed lines in FIG. 23. The structure and operation of the peak-reduction architecture of FIG. 23 is such that four parallel automatic-gain control (AGC) loops are driven by channel-specific measurements, yet they result in feedback to two serial common-mode operations (excursion generation and peak-scaling) that impact all channels. The net result is a unique ability to minimize peak-to-average-power-ratio (PAR) for any combination of channel powers, and to dynamically adapt as circumstances evolve. Since this processing yields a very sharply defined peak magnitude under dynamically-varying channel power levels, it is possible to dynamically control the maximum supply voltage to the amplifier used to amplify this signal. Since the power consumption of the amplifier is proportional to its supply voltage, the sharply defined signal peak permits substantial reduction in amplifier power consumption over all operating conditions. In an alternative embodiment, a threshold calculation circuit 2208 receives a feedback signal from the output of the excursion filter system 514 and adjusts the magnitude threshold 412 according to the magnitude of the output signal. The magnitude threshold 412 may be adjusted based on the peak-power reduction component 212 output according to any suitable algorithm or process. For example, the threshold calculation circuit 2208 may compare the output signal power or the average output signal power over a selected time duration to a selected level, such as the maximum power level of the amplifier 216. If the output power level is substantially lower than the selected level, the threshold calculation circuit 2208 may adjust the magnitude threshold 412 to a lower level. The magnitude threshold 412 may also be scaled in response to other criteria or output, for example in response to the output of the peak-power reduction component 212.

The performance of the embodiment of the invention as illustrated in FIG. 23 is shown in FIGS. 27B and 27C, for a combination of four strong channels, and in FIGS. 27D and 27E, for one weak channel and three strong channels. FIG. 27B shows raw 2720 and peak-reduced 2722 CCDF plots for four strong channels. FIG. 27C shows 10× gain 2726 and EVM 2724 variation versus time for four strong channels using EVM-based excursion channel filter gain control. FIG. 27D shows raw 2728 and peak-reduced 2730 CCDF plots for one weak channel and three strong channels. FIG. 27E shows EVM variation 2732 and 10× gain versus time for one weak channel 2736 and three strong channels 2734 using EVM-based excursion channel filter gain control. In both cases, EVM values for all four channels quickly converge to the defined EVM target of 17%.

A further aspect of the inventive peak-reduction process targets the rate of decline in the CCDF curves. An ideal peak-reducer would exhibit a nearly vertical limit line implying the signal magnitude never exceeds the limit. However, in reality the CCDF curves exhibit a slight flare-out that represents two primary mechanisms: 1) scaling errors and 2) finite automatic gain control bandwidth and delay. The scaling errors usually occur because of the influence on scaling of proximate peak events, and because extremely long peak events can cause significant scale errors. Both flare-out mechanisms may be mitigated by simply passing the peak-reduced waveform through a second application of the same processing. FIG. 27F depicts an exemplary improved CCDF plot achieved using two cascaded peak-reduction operations. FIG. 27F shows an exemplary raw CCDF 2738, a peak-reduced CCDF 2740, and a peak-reduced CCDF 2742 that has undergone two cascaded peak-reduction operations.

The signal provided by the peak-power reduction component 212 may also be adjusted to compensate for changes in the magnitude of the signal incurred by the excursion filter system 514, for example by the channel scaling (gain control) circuits 548. For example, the common-mode scaling system 820 may also be configured to adjust the common-mode scaling factor to compensate for magnitude changes caused by the various channel circuits, such as channel gain adjustments that may be effected by the channel scaling circuits 548. Common-mode scaling may thus be applied to, for example, EVM control. Alternatively, the adjustment may be performed by other components, such as a downstream amplifier, and the common-mode scaling system 820 may adjust the signal according to any suitable criteria or information, such as feedback from the excursion filter system 514, and/or approximations of changes in the signal induced by other components such as the excursion filter system 514.

The signal magnitude may be adjusted in any suitable manner and according to any suitable criteria. For example, in the present exemplary embodiment, the common-mode scaling circuit 820 receives one or more feedback signals from the channel scaling circuits 548. The common mode scaling circuit 820 adjusts the common-mode scaling magnitude based on the feedback signals. As is apparent, this feedback approach is consistent with the exemplary embodiments of the invention as described in FIGS. 21 and 23.

In a preferred embodiment, the feedback signals comprise the scaling factor, with a potentially-constrained minimum value, generated by each channel scaling circuit 548. For example, referring again to FIG. 21, the output of each comparison circuit 2212 may be provided to the common-mode scaling system 820. The common-mode scaling system 820 may also adjust the common-mode scaling factor according to any other appropriate criteria, such as the known impulse responses of the various channel filters 518 that comprise the excursion filter system 514 in FIG. 24.

Note that in FIG. 21 the output of comparison circuits 2212 is shown as provided directly to the scaling system 820. In an exemplary embodiment, the scaling system 820 may be configured to adjust the scaling according to an approximation of the changes incurred by excursion filter system 514 or other components. However, the output of comparison circuits 2212 may be provided directly to the scaling system 820 without any such approximation processing. In an embodiment including approximation processing, the approximation may be generated in any suitable manner, such as by an approximation filter having an impulse response similar to that of the excursion filter system 514. For example, referring to FIGS. 22 and 28, the scaling system 820 may comprise a scaling delay circuit 2510, a scaling (approximation) filter 2512, and a peak scaling circuit 2514. The incoming signal is provided to the scaling delay circuit 2510 and the scaling (approximation) filter 2512. The scaling delay circuit 2510 delays propagation of the signal while the scaling (approximation) filter 2512 and the peak scaling circuit 2514 process the signal. The scaling (approximation) filter 2512 processes the signal to approximate the effect of the excursion filter system 514 on the signal. The peak scaling circuit 2514 adjusts the scaling applied to the excursion samples based on the effects indicated by the scaling (approximation) filter 2512.

The scaling (approximation) filter 2512 may be configured in any suitable manner to approximate one or more effects of the excursion filter system 514. The output sequence corresponding to each set of excursion samples may be computed for any excursion filter system 514. The output may comprise a smoothed version of the excursion waveform, sandwiched in between oscillations decaying in each direction of time. The oscillations are required to satisfy the spectral constraints imposed by the excursion filter system 514. The scaling (approximation) filter 2512 may generate an accurate estimate of the smoothed excursion itself, without the oscillatory extensions, and the peak of the filtered excursion or peak event determined. In one embodiment, the approximation filter 2512 determines the scaling for each set of excursion samples as the ratio of the peak magnitude of the input (unfiltered) peak event to the maximum magnitude of the filtered peak event, which encourages the peak-adjusted output signal maximum peaks to closely match the defined magnitude threshold 412.

In the present embodiment, the scaling (approximation) filter reflects the effects of the various channel filters 518 and/or other components comprising the excursion filter system 514. For example, the approximation filter may comprise simplified versions of each of the low pass filters and their related components. Referring to FIGS. 14 and 28, each low pass filter 522 may comprise a multi-tap digital filter. To meet spectral requirements, the low pass filter 522 may be a relatively complex filter having dozens or hundreds of taps. Low pass filter 522 is a single channel's LPF, whereas the impulse response of interest is that of the excursion filter system 514. The impulse response of the excursion filter system 514 is substantially completely determined by the impulse response of the lowpass filters 522, the channel offset frequencies 318 and the output of the channel scaling/gain control element 540. The approximation filter 2512 suitably comprises a simplified version of the impulse response of the excursion filter system 514, and may be implemented using substantially fewer taps, such as five to ten taps. The approximation filter 2512 is suitably configured to share the same tap values around the main lobe 2610 of the impulse response 2612 of the excursion filter system 514, but only extends for a portion of the impulse response 2612 of the excursion filter system 514. Although the output of the approximation filter 2512 may not generate a signal compliant with the spectral requirements, the peak magnitude of the approximation filter 2512 approximates the peak magnitude of the excursion filter system 514.

Referring to FIG. 28, the peak scaling circuit 2514 receives the unscaled excursion 410 from the scaling (approximation) filter 2512 and adjusts the scaling applied to the original signal accordingly, for example to counter the effects of the excursion filter system 514 on the magnitude of the excursion. In one embodiment, the peak scaling system 2514 compares the signal from the approximation filter 2512 to the original signal and adjusts the scaling accordingly. Thus, if the maximum sample magnitude of a peak event processed by the scaling (approximation) filter is 80% of the maximum sample magnitude of the unfiltered peak event, the peak scaling circuit 2514 may apply a scaling factor of 1.25 to the original peak event samples to compensate for the attenuation induced by the scaling (approximation) filter 2512.

As is apparent for this and other embodiments, signals may be scaled, for example, to maximize peak reduction and remain within EVM specifications. The channel filters 518 may attenuate individual channel signals, reducing peak-reduction, if the noise in that channel is approaching its EVM limits or other applicable signal quality criteria. In addition, the common-mode scaling circuit 820 may scale the samples in each peak event to better match the magnitude threshold 412 by compensating for changes in the excursion signal induced by the excursion filter system 514. As is readily apparent, the embodiment of the invention illustrated by FIG. 28 is consistent with the exemplary embodiments of the invention illustrated in FIGS. 21 and 23.

The channel gain control circuit 548 may also be configured to provide time slot scaling for time division multiple access (TDMA) or time division duplexing (TDD) signals, for example in conjunction with smooth "window" curves to transition between the nominal scalings used for successive time slots. In particular, various time division schemes, such as those employed by burst CDMA and GSM, require the signal to smoothly decrease in magnitude to substantially zero between time slots. Accordingly, the channel gain control circuit 548 may be configured to apply a time-varying gain to the filtered signal 538. For example, referring to FIG. 29, the channel gain control circuit 548 may apply a unity gain 850 to the filtered signal 538 for most of a time division time slot 852, such as using a Blackman window or Hamming window. At the ends 854 of the time slot 852, the gain is gradually adjusted between zero and unity such that the filtered signal 538 substantially smoothly ramps up from zero to unity gain 850, is held at unity gain 850 for most of the time slot 852, then substantially smoothly ramps back down to zero near the end of the time slot 852. This smooth ramping reduces undesirable spectral artifacts associated with rapid signal magnitude variations at each end of a time slot.

In one embodiment, the decay rate of the signal from the channel filter 518 may be too slow to fully decay before the next time slot time. Accordingly, referring to FIG. 30, the channel filter 518 may be configured with additional filters 522 and a switching system 858 for each channel. The additional filters 522 may comprise any number of additional filters 522 that may be required to filter the signal while one or more other filters 522 allow their signals to decay. In the present embodiment, each channel includes two filters 522. The switching system 858 switches the input and output for the channel between the two filters 522 according to a time slot timing signal 860. Thus, a first time slot signal is filtered by the first filter 522A. At the end of the time slot, the switching system 858 switches the signal input and output to the second filter 522B. The second filter 522B handles the filtering during the second time slot while the output of the first filter 522A decays to zero. The switching system 858 switches back and forth between the filters 522 so that each filter 522 is allowed to decay for the duration of a time slot before being used for the following time slot.

In various embodiments, the additional filters 522 and the switching system 858 may be unnecessary, for example due to the operation of the time scaling window and the channel gain control circuit 548 adjusting the power of the filtered signal 538 in accordance with basestation control signals, which may include maximum channel and time slot noise limits derived from the modulation and EVM for that channel and time slot. In particular, the nominal gain across each time slot may be varied to match the average relative signal magnitudes in each time slot, or to assure EVM compliance as previously described. For example, referring to FIG. 31, the energy in a first time slot $TS_1$ is significantly higher than the energy in a second time slot $TS_2$. The channel filter 518 is suitably configured as a magnitude adjustment circuit to adjust the gain of the filtered signal 538 to a lower magnitude during the second time slot $TS_2$. The filtered energy from a high-level time slot excursion is suitably attenuated sufficiently to reduce potential interference with a weaker signal in a subsequent time slot. The channel gain control circuit 548 is configured to adjust the amplitude of the filtered signal 538, which includes the portion of the signal that may be caused by the extended decay of the filter. As a result, the portion of the filtered signal 538 attributable to the extended decay of the filter is attenuated, which tends to reduce its effect on the intended signal.

Following processing by prior elements of the system, including appropriate filtering, scaling and adjusting, the scaled and filtered excursion signal 552 is provided to the excursion reducer 544, as shown in, for example, in FIG. 14. The excursion reducer 544 also receives the baseband modulated signal 222 via the delay element 510. The delay element 510 is configured to compensate for the propagation time of the signal through the interpolator 502, excursion signal generator 512, scaling system 820, and excursion filter system 514. The excursion reducer 544 combines the baseband modulated signal 222 and the scaled and filtered excursion signal 542, for example, by subtracting the scaled and filtered excursion signal 542 from the delayed version of the baseband modulated signal 222. The excursion reducer 544 generates a peak-reduced signal 224 having a maximum magnitude approximately equal to the magnitude threshold 412 and with few or no components outside the approved bandwidth. The peak-reduced signal 224 is provided to the DAC 214, which converts the peak-reduced signal 224 into an analog signal 226 for amplification and transmission.

The communication system 100 may be used in various environments to transfer information, and may be adapted to the particular environment or application. In various applications, the excursion filter system 514, the excursion signal generator 512, or other elements of the system may be changed or optimized for the environment or application. Further, additional elements may be added to or removed from the communications system 100 to facilitate or improve operation for the particular environment or application. For example, various applications or environments may utilize relatively low sampling rates compared to the carrier frequencies. For example, under certain wireless communication standards, such as systems conforming to standards such as IEEE 802.11 and 802.16 standards employing orthogonal frequency division multiplexing (OFDM), sampling rates may approach the Nyquist limits for the carrier frequencies. The peak-power reduction component 212 may be configured for improved operation in such low sampling rate applications. In a further example application requiring increased sampling frequency, the peak-power reduction component 212 may be adapted to reduce noise in the signals of interest. In one embodiment, the peak-power reduction component 212 is suitably configured to inhibit the addition of noise to the signals of interest that may be caused by the peak-power reduction process, such as intermodulation noise generated by the excursion signal generator 512. In particular, the sampling frequency of the baseband modulated signal 222 may be substantially increased above the Nyquist sampling rate to inhibit aliasing of the excursion energy into the signal spectrum.

Referring to FIG. 32, an alternative exemplary embodiment of a peak-power reduction component 212 according to various aspects of the present invention comprises the delay element 510, the excursion signal generator 512, the excursion filter system 514, a sampling rate increase system 502, and a sampling rate reduction system 562. The sampling rate increase (interpolator) system 502 increases the sampling rate of the baseband modulated signal 222, while the sampling rate reduction system 562 correspondingly reduces the sampling rate of the baseband modulated signal to its original rate. By increasing the sampling rate of the baseband modulated signal 222 before generating the excursion signal, noise components caused by aliasing fall outside the spectra of the channel signals, and may thus be filtered by the excursion filter system 514. FIG. 32 is described in terms of an OFDMA application, but of course the techniques described therein are equally applicable to any low sampling rate applications or environment.

The sampling rate increase system 502 of FIG. 32 may comprise any suitable system for increasing the sampling rate of the baseband modulated signal 222. In the present embodiment, the sampling rate increase system 502 consists of an interpolator configured to generate intermediate samples based on the original samples in the baseband modulated signal 222. The interpolator may generate the intermediate samples according to any suitable algorithm, such as a linear interpolation. In addition, the interpolator may generate any suitable number of intermediate samples to achieve a desired increased frequency. In the present embodiment, the interpolator increases the sampling rate by a factor of about four.

Likewise, the sampling rate reduction system 562 of FIG. 32 may comprise any suitable system for decreasing the sampling rate of the signal from the excursion filter system 514 back to the original sampling rate. In the present embodiment, the sampling rate reduction system 562 includes a decimator configured to remove intermediate samples from the signal. In the present embodiment, the decimator decreases the sampling rate by a factor of about four to return the signal to the original sampling rate of the baseband modulated signal. It has been found that including an interpolator and decimator in this manner to increase and decrease the signal sampling rate, respectively, may advantageously reduce the power required for the signal processing operations described and claimed herein significantly, in the present embodiment by approximately a factor of four. Power efficiencies may also be expected for other interpolator/decimator sampling rate scenarios. In a preferred embodiment, the decimation may occur between the scaling 820 and the excursion filter system 514, in order to reduce the implementation complexity and power consumption of the excursion filter system 514.

In the OFDM environment, the excursion generator 512 in FIG. 32 is understood to incorporate the peak parsing and scaling functions previously described in detail. The excursion filter system 514 may include an OFDM gain mask 564 configured to provide conformance to the regulatory and standard-based spectral constraints, but very importantly, the channel mask representing the maximum allowed channel noise power (as determined by the signal power and channel EVM constraint) previously described. The preferred embodiment of the gain mask operation 564 is a vector dot product of the frequency domain scaled excursion and the mask which results from the combination of the regulatory spectral constraints and channel noise power restrictions. The peak-power reduction component 212 may also perform additional processing, such as substantially removing the DC component of the signal, for example by subtracting the average of the in-phase and quadrature components of the signal from the samples corresponding to the original samples.

The excursion filter system 514 may be further adapted for systems using fast Fourier transforms (FFTs), such as an OFDMA communications system under the IEEE 802.16 standard. For example, referring to the alternative exemplary embodiment of FIG. 32, a peak-power reduction component 212 according to various aspects of the present invention comprises the delay element 510, the excursion signal generator 512, the excursion filter system 514, the sampling rate increase (interpolator) system 502, and the sampling rate reduction (decimator) system 562. The modulator 210 is configured to generate a signal, such as an 802.16a OFDM symbol having cyclic prefix data. In the present embodiment, the excursion filter system 514 includes an FFT filter system. To facilitate the use of the FFTs, the sampling rate increase system 502 is suitably configured to increase the sampling rate of the baseband modulated signal 222 such that the total number of samples in the OFDM vector corresponds to a power of two, such as by a factor of four. Similarly, the sampling rate reduction system 562 reduces the sampling rate of the baseband modulated signal by the same amount.

In an alternative embodiment of the decimation and filtering systems of FIG. 32, the sample rate reduction system may be eliminated and its function implemented by the FFT filter system. By performing a larger FFT at the higher sample rate and discarding portions of the frequency domain beyond the bandwidth of the baseband modulated signal, effective decimation prior to the gain mask operation may be realized. Of these two alternatives, the preferred decimation and filtering embodiment must be chosen based on the processing resources available in the specific application.

Alternatively, the excursion waveform may only be generated for the raw OFDMA waveform, excluding the cyclic prefix, and the output of the peak-reduction then modified to create a cyclic prefix corresponding to the peak-reduction waveform itself, with the composite waveform then subtracted from the delayed signal to accomplish peak reduction. For example, the excursion waveform may be generated without the cyclic prefix. After the peak-reduction process, for example after the summing of the various filtered excursions, a cyclic prefix may then be generated based on the peak-reduction waveform. The prefix is then attached to the front and back end of the transmitted signal.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationships or physical connections may be present in a practical system.

One such alternative embodiment simply uses a fixed common-mode scaling value for all excursion samples, where that scale value and an associated magnitude threshold value are selected to optimize peak-reduction for the case where all channels are near their maximum power. The magnitude threshold value may then be selectively increased to ensure EVM compliance when necessary as some channel power levels decrease. Even though this embodiment eliminates both the adaptive common-mode and channel-specific scaling, it provides substantial peak-reduction benefit and is an application of our inventive concept and architecture.

The present invention has been described above with reference to preferred embodiments. However, changes and modifications may be made to the preferred embodiments without departing from the scope of the present invention. The order of processing steps described above with respect to the method aspects of the present invention are representative and the invention may be practiced in any sequence within the broad scope of the invention as described and claimed which accomplishes the stated objectives. These and other changes or modifications are intended to be included within the scope of the present invention.

The invention claimed is:

1. A signal processing system, comprising
   an excursion signal generator configured to identify an excursion in a first signal exceeding a signal magnitude threshold and generate a corresponding excursion signal, wherein the excursion signal comprises one or more excursion events, each of which may comprise multiple peak events, and wherein the first signal comprises one or more channel signals transmitted via one or more channels,
   an excursion signal scaling system configured to adjust the magnitude of the excursion signal, wherein the excursion signal scaling system is configured to process multiple excursion events of the excursion signal and wherein the excursion signal scaling system is further configured to scale unique peak events by unique scale factors, an excursion filter system configured to filter selected frequencies from the excursion signal, and an excursion reducer configured to subtract the scaled and filtered excursion signal from a suitably delayed version of the first signal.

2. The signal processing system of claim 1, wherein the excursion signal scaling system is configured to scale a plurality of peaks of the excursion signal.

3. The signal processing system of claim 1, wherein the excursion signal scaling system is configured to scale the excursion signal based on the relative difference between the signal peak value and the magnitude threshold.

4. The signal processing system of claim 1, wherein the excursion signal scaling system is configured to apply unique scale factors to unique peak events comprising an excursion event.

5. The signal processing system of claim 1, wherein the excursion signal scaling system is configured to scale the excursion signal based on the ratio of the maximum magnitude of the unfiltered peak event to the maximum magnitude of the filtered peak event.

6. The signal processing system of claim 1, wherein the excursion filter system is configured to filter the scaled excursion signal to remove spurious spectral energy outside a defined spectral mask.

7. The signal processing system of claim 6, wherein the excursion filter system is configured to filter each channel signal pursuant to a unique spectral mask.

8. The signal processing system of claim 1, wherein the excursion signal scaling system is further configured to adaptively adjust the scaling of the excursion signal based on the outputs of the channel filters comprising the excursion filter system.

9. The signal processing system of claim 1, wherein the signal magnitude threshold is a dynamic threshold.

10. The signal processing system of claim 9, wherein the dynamic threshold is based on estimated channel headroom.

11. The signal processing system of claim 1, wherein the excursion signal scaling system is further configured to adjust the unique scale factors based on a magnitude effect on the excursion signal caused by the filter system.

12. The signal processing system of claim 1, wherein the excursion signal scaling system further comprises an approximation filter configured to approximate a magnitude effect of the excursion filter system.

13. The signal processing system of claim 12, wherein the excursion signal scaling system is further configured to scale the excursion signal based on an unfiltered maximum magnitude of the peak event and a corresponding maximum magnitude of the peak event after being filtered by the approximation filter.

14. The signal processing system of claim 1, further configured to increase the sampling rate of the signal used to generate the excursion signal.

15. The signal processing system of claim 14, further configured to decrease the sampling rate of the processed signal prior to subtraction from a suitably delayed version of the first signal.

16. The signal processing system of claim 1 further configured to process OFDM signals selected from the group consisting of TDD, GSM, CDMA, WCDMA, TDMA, OFDM, and OFDMA signals, and signals formed as hybrids of this group.

17. A method of processing a signal, comprising:

identifying an excursion in a first signal exceeding a signal magnitude threshold, generating an excursion signal corresponding to the excursion in the first signal, wherein the excursion signal comprises one or more excursion events, each of which may comprise multiple peak events, and wherein the first signal comprises one or more channel signals transmitted via one or more channels, adjusting the magnitude of the excursion signal by applying unique scale factors to unique excursion events, filtering selected frequencies from the scaled excursion signal, and subtracting the scaled and filtered excursion signal from a suitably delayed version of the first signal.

18. The method of claim 17, further comprising scaling of a plurality of peaks of the excursion signal.

19. The method of claim 17, further comprising scaling the excursion signal based on the relative difference between the unscaled excursion and the threshold.

20. The method of claim 17, further comprising applying unique scale factors to unique peak events comprising an excursion event.

21. The method of claim 17, further comprising scaling the excursion signal based on the ratio of the maximum magnitude of the unfiltered peak event to the maximum magnitude of the filtered peak event.

22. The method of claim 17, further comprising filtering the scaled excursion signal to remove spurious spectral energy outside a defined spectral mask.

23. The method of claim 22, further comprising filtering each channel signal pursuant to a unique spectral mask.

24. The method of claim 17, further comprising adaptively adjusting the scaling of the excursion signal based on the outputs of the channel filters comprising the excursion filter system.

25. The method of claim 17, further comprising varying the signal magnitude threshold.

26. The method of claim 25, further comprising varying the signal magnitude threshold based on a power requirement.

27. The method of claim 17, further comprising adjusting unique scale factors based on a magnitude effect on the excursion signal caused by the filter system.

28. The method of claim 17, further comprising adjusting the excursion signal based on an approximation of a magnitude effect of the excursion filter system.

29. The method of claim 28, further comprising adjusting the excursion signal based on an unfiltered maximum magnitude of the peak event and a corresponding approximation of a magnitude of the peak event.

30. The method of claim 17, further comprising increasing the sampling rate of the signal used to generate the excursion signal.

31. The method of claim 30, further comprising decreasing the sampling rate of the processed signal prior to subtraction from a suitably delayed version of the first signal.

32. The method of claim 17, wherein the signal is selected from the group including TDD, GSM, CDMA, WCDMA, TDMA, OFDM, and OFDMA signals, and signals formed as hybrids of this group.

33. A signal processing system, comprising:

an excursion signal generator configured to identify an excursion in a first signal exceeding a signal magnitude threshold and generate a corresponding excursion signal, wherein the excursion signal comprises one or more channel signals transmitted via one or more channels, an excursion signal scaling system configured to adaptively adjust the magnitude of the excursion signal based on a channel signal quality, an excursion filter system configured to filter selected frequencies from the excursion signal, and an excursion reducer configured to subtract the adjusted and filtered excursion signal from a suitably delayed version of the first signal.

34. The signal processing system of claim 33, wherein the channel signal quality is based on an error vector magnitude specification.

35. The signal processing system of claim 33, wherein the excursion signal scaling system is further configured to adaptively adjust the magnitude of the excursion signal based on a specified channel error vector magnitude value and a residual noise level.

36. The signal processing system of claim 33, wherein the excursion signal scaling system is configured to determine an amount of noise that may be added to a channel signal without exceeding a limit and adaptively adjust the magnitude of the excursion signal based on the determined amount of noise.

37. The signal processing system of claim 33, further configured to increase the sampling rate of the signal used to generate the excursion signal.

38. The signal processing system of claim 37, further configured to decrease the sampling rate of the processed signal prior to subtraction from a suitably delayed version of the first signal.

39. A method for processing a signal, comprising:
identifying an excursion in a first signal exceeding a signal magnitude threshold,
generating an excursion signal corresponding to the excursion in the first signal, wherein the excursion signal comprises one or more channel signals transmitted via one or more channels,
adaptively adjusting the magnitude of the excursion signal based on a channel signal quality,
filtering selected frequencies from the excursion signal, and
subtracting the adjusted and filtered excursion signal from a suitably delayed version of the first signal.

40. The method of claim 39, wherein the channel signal quality is an error vector magnitude.

41. The method of claim 39, wherein the magnitude of the excursion signal is adaptively adjusted based on a specified channel error vector magnitude value and a residual noise level.

42. The method of claim 39, wherein the magnitude of the excursion signal is adaptively adjusted based on determining an amount of noise that may be added to a channel signal without exceeding a limit and adaptively adjusting the magnitude of the excursion signal based on the determined amount of noise.

43. The method of claim 39, further comprising increasing the sampling rate of the signal used to generate the excursion signal.

44. The method of claim 43, further comprising decreasing the sampling rate of the processed signal prior to subtraction from a suitably delayed version of the first signal.

45. A signal processing system, comprising
an excursion signal generator configured to identify an excursion in a first signal exceeding a signal magnitude threshold and generate a corresponding excursion signal, wherein the excursion signal comprises one or more excursion events, each of which may comprise multiple peak events, and wherein the first signal comprises one or more channel signals transmitted via one or more channels, an excursion signal scaling system configured to adjust the magnitude of the excursion signal, wherein the excursion signal scaling system is configured to process multiple excursion events of the excursion signal and wherein the excursion signal scaling system is further configured to apply a fixed real scaling factor to each excursion event, an excursion filter system configured to filter selected frequencies from the excursion signal, and an excursion reducer configured to subtract the scaled and filtered excursion signal from a suitably delayed version of the first signal.

46. The signal processing system of claim 45, wherein the fixed real scaling factor is equal to unity.

47. The signal processing system of claim 45, wherein the excursion signal scaling system is configured to scale a plurality of peaks of the excursion signal.

48. The signal processing system of claim 45, wherein the excursion signal scaling system is configured to scale the excursion signal based on the relative difference between the signal peak value and the magnitude threshold.

49. The signal processing system of claim 45, wherein the excursion signal scaling system is configured to apply unique scale factors to unique peak events comprising an excursion event.

50. The signal processing system of claim 45, wherein the excursion signal scaling system is configured to scale the excursion signal based on the ratio of the maximum magnitude of the unfiltered peak event to the maximum magnitude of the filtered peak event.

51. The signal processing system of claim 45, wherein the excursion filter system is configured to filter the scaled excursion signal to remove spurious spectral energy outside a defined spectral mask.

52. The signal processing system of claim 51, wherein the excursion filter system is configured to filter each channel signal pursuant to a unique spectral mask.

53. The signal processing system of claim 45, further configured to increase the sampling rate of the signal used to generate the excursion signal.

54. The signal processing system of claim 53, further configured to decrease the sampling rate of the processed signal prior to subtraction from a suitably delayed version of the first signal.

55. The signal processing system of claim 45, further configured to process OFDM signals selected from the group consisting of TDD, GSM, CDMA, WCDMA, TDMA, OFDM, and OFDMA signals, and signals formed as hybrids of this group.

56. A method of processing a signal, comprising:
identifying an excursion in a first signal exceeding a signal magnitude threshold,
generating an excursion signal corresponding to the excursion in the first signal, wherein the excursion signal comprises one or more excursion events, each of which may comprise multiple peak events, and wherein the first signal comprises one or more channel signals transmitted via one or more channels,
applying a fixed real scaling factor to each excursion event,
filtering selected frequencies from the scaled excursion signal, and
subtracting the scaled and filtered excursion signal from a suitably delayed version of the first signal.

57. The method of claim 56, wherein the fixed real scaling factor is equal to unity.

58. The method of claim 56, further comprising scaling of a plurality of peaks of the excursion signal.

59. The method of claim 56, further comprising scaling the excursion signal based on the relative difference between the unscaled excursion and the threshold.

60. The method of claim 56, further comprising applying unique scale factors to unique peak events comprising an excursion event.

61. The method of claim 56, further comprising scaling the excursion signal based on the ratio of the maximum magnitude of the unfiltered peak event to the maximum magnitude of the filtered peak event.

62. The method of claim 56, further comprising filtering the scaled excursion signal to remove spurious spectral energy outside a defined spectral mask.

63. The method of claim 62, further comprising filtering each channel signal pursuant to a unique spectral mask.

64. The method of claim 56, further comprising increasing the sampling rate of the signal used to generate the excursion signal.

65. The method of claim 64, further comprising decreasing the sampling rate of the processed signal prior to subtraction from a suitably delayed version of the first signal.

66. The method of claim 56, wherein the signal is selected from the group including TDD, GSM, CDMA, WCDMA, TDMA, OFDM, and OFDMA signals, and signals formed as hybrids of this group.

* * * * *